(12) United States Patent
Nagarajan et al.

(10) Patent No.: US 11,942,972 B2
(45) Date of Patent: Mar. 26, 2024

(54) RADIO FREQUENCY SWITCH CONTROL CIRCUITRY

(71) Applicant: Skyworks Solutions, Inc., Irvine, CA (US)

(72) Inventors: Sachin Nagarajan, Irvine, CA (US); Abhishekh Devaraj, Irvine, CA (US); Florinel G. Balteanu, Irvine, CA (US); Yunyoung Choi, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 125 days.

(21) Appl. No.: 17/663,889

(22) Filed: May 18, 2022

(65) Prior Publication Data

US 2022/0416816 A1    Dec. 29, 2022

Related U.S. Application Data

(60) Provisional application No. 63/202,867, filed on Jun. 28, 2021.

(51) Int. Cl.
| | | |
|---|---|---|
| H04B 1/00 | (2006.01) | |
| G05F 3/16 | (2006.01) | |
| H02M 1/00 | (2006.01) | |
| H02M 3/07 | (2006.01) | |
| H03K 3/03 | (2006.01) | |
| H04B 1/44 | (2006.01) | |

(52) U.S. Cl.
CPC .............. *H04B 1/006* (2013.01); *G05F 3/16* (2013.01); *H02M 1/0041* (2021.05); *H02M 3/07* (2013.01); *H03K 3/0315* (2013.01); *H04B 1/44* (2013.01)

(58) Field of Classification Search
CPC ........ H02M 3/07; H02M 3/071; H02M 3/072; H02M 3/073; H02M 3/076
See application file for complete search history.

(56) References Cited

U.S. PATENT DOCUMENTS

| | | | |
|---|---|---|---|
| 4,703,205 | A | 10/1987 | Heimbigner |
| 4,743,862 | A | 5/1988 | Scheinberg |
| 5,828,607 | A | 10/1998 | Bushey et al. |
| 6,731,173 | B1 | 5/2004 | Thompson |
| 6,917,246 | B2 | 7/2005 | Thompson |
| 7,554,306 | B2 | 6/2009 | Lee et al. |
| 7,898,230 | B2 | 3/2011 | Lee et al. |
| 9,092,393 | B2 | 7/2015 | Whitefield et al. |

(Continued)

FOREIGN PATENT DOCUMENTS

WO    WO 2016/023007    2/2016

*Primary Examiner* — Diana J. Cheng
(74) *Attorney, Agent, or Firm* — Knobbe, Martens, Olson & Bear, LLP

(57) ABSTRACT

Apparatus and methods for radio frequency (RF) switch control are provided. In certain embodiments, a level shifter for an RF switch includes a first level-shifting n-type transistor, a first cascode n-type transistor in series with the first level-shifting n-type transistor between a negative charge pump voltage and a first output that provides a first switch control signal, a first level-shifting p-type transistor, a first cascode p-type transistor in series with the first level-shifting p-type transistor between a positive charge pump voltage and the first output, and a second cascode p-type transistor between a regulated voltage and a gate of the first level-shifting n-type transistor and controlled by a first switch enable signal.

20 Claims, 16 Drawing Sheets

(56) References Cited

U.S. PATENT DOCUMENTS

| | | | |
|---|---|---|---|
| 9,361,995 B1* | 6/2016 | Tran | G11C 5/145 |
| 9,385,714 B2 | 7/2016 | Bechman | |
| 9,467,124 B2 | 10/2016 | Crandall | |
| 9,577,626 B2 | 2/2017 | Crandall | |
| 9,837,993 B2* | 12/2017 | Crandall | H03K 3/356104 |
| 9,847,774 B2 | 12/2017 | Crandall | |
| 9,990,322 B2 | 6/2018 | Whitefield et al. | |
| 10,103,726 B2 | 10/2018 | Wilz et al. | |
| 10,643,727 B2 | 5/2020 | Zhou et al. | |
| 10,931,193 B2* | 2/2021 | Tokuda | H03K 17/687 |
| 2016/0094207 A1 | 3/2016 | Crandall | |
| 2017/0093153 A1 | 3/2017 | Keane et al. | |
| 2020/0144912 A1 | 5/2020 | Tokuda et al. | |
| 2021/0028773 A1 | 1/2021 | Balteanu et al. | |
| 2021/0028800 A1 | 1/2021 | Balteanu et al. | |

* cited by examiner

RADIO FREQUENCY SWITCH CONTROL CIRCUITRY

CROSS-REFERENCE TO RELATED APPLICATIONS

This application claims the benefit of priority under 35 U.S.C. § 119 of U.S. Provisional Patent Application No. 63/202,867, filed Jun. 28, 2021 and titled "RADIO FREQUENCY SWITCH CONTROL CIRCUITRY," which is herein incorporated by reference in its entirety.

BACKGROUND

Field

Embodiments of the invention relate to electronic systems, and in particular, to radio frequency (RF) communication systems.

Description of the Related Technology

Radio frequency (RF) communication systems can be used for transmitting and/or receiving signals of a wide range of frequencies. For example, an RF communication system can be used to wirelessly communicate RF signals in a frequency range of about 30 kHz to 300 GHz, such as in the range of about 400 MHz to about 7.125 GHz for Frequency Range 1 (FR1) of the Fifth Generation (5G) communication standard or in the range of about 24.250 GHz to about 71.000 GHz for Frequency Range 2 (FR2) of the 5G communication standard.

Examples of RF communication systems include, but are not limited to, mobile phones, tablets, base stations, network access points, customer-premises equipment (CPE), laptops, and wearable electronics.

SUMMARY

In certain embodiments, the present disclosure relates to a mobile device. The mobile device includes a power management system including a positive charge pump configured to generate a positive charge pump voltage, a negative charge pump configured to generate a negative charge pump voltage, and a voltage regulator configured to generate a regulated voltage. The mobile device further includes a front end system including a radio frequency switch controlled by a first switch control signal, and a level shifter operable to level shift a first switch enable signal to generate the first switch control signal at a first output. The level shifter includes a first level-shifting n-type transistor and a first cascode n-type transistor in series between the negative charge pump voltage and the first output, a first level-shifting p-type transistor and a first cascode p-type transistor in series between the positive charge pump voltage and the first output, and a second cascode p-type transistor between the regulated voltage and a gate of the first level-shifting n-type transistor and controlled by the first switch enable signal.

In some embodiments, the level shifter is further operable to level shift a second switch enable signal to generate a second switch control signal at a second output, the second switch enable signal of complementary polarity to the first switch enable signal. According to a number of embodiments, the level shifter further includes a second level shifting n-type transistor in series with the second cascode p-type transistor between the regulated voltage and the negative charge pump voltage, a third cascode p-type transistor, and a third level shifting n-type transistor in series with the third cascode p-type transistor between the regulated voltage and the negative charge pump voltage. In accordance with various embodiments, the level shifter further includes a fourth level shifting n-type transistor and a second cascode n-type transistor in series between the second output and the negative charge pump voltage, and a second level shifting p-type transistor and a fourth cascode p-type transistor in series between the positive charge pump voltage and the second output.

In several embodiments, the front end system further includes a power amplifier configured to provide a radio frequency signal to the radio frequency switch.

In some embodiments, the power management system further includes a charge pump clock generator including a multi-phase oscillator configured to generate a plurality of oscillator clock signals, and a clock phase logic and combining circuit configured to process the plurality of oscillator clock signals to generate a first clock signal of higher frequency than an oscillation frequency of the multi-phase oscillator, the first clock signal operable to control at least one of the positive charge pump or the negative charge pump. According to a number of embodiments, the clock phase logic and combining circuit is further configured to generate a second clock signal offset in phase from the first clock signal, the first clock signal operable to control the positive charge pump and the second clock signal operable to control the negative charge pump.

In certain embodiments, the present disclosure relates to a radio frequency switch system. The radio frequency switch system includes a radio frequency switch configured to receive a radio frequency signal and controlled by a first switch control signal, a positive charge pump configured to generate a positive charge pump voltage, a negative charge pump configured to generate a negative charge pump voltage, a voltage regulator configured to generate a regulated voltage, and a level shifter operable to level shift a first switch enable signal to generate the first switch control signal at a first output. The level shifter includes a first level-shifting n-type transistor and a first cascode n-type transistor in series between the negative charge pump voltage and the first output, a first level-shifting p-type transistor and a first cascode p-type transistor in series between the positive charge pump voltage and the first output, and a second cascode p-type transistor between the regulated voltage and a gate of the first level-shifting n-type transistor and controlled by the first switch enable signal.

In some embodiments, the level shifter is further operable to level shift a second switch enable signal to generate a second switch control signal at a second output, the second switch enable signal of complementary polarity to the first switch enable signal. According to a number of embodiments, the level shifter further includes a second level shifting n-type transistor in series with the second cascode p-type transistor between the regulated voltage and the negative charge pump voltage, a third cascode p-type transistor, and a third level shifting n-type transistor in series with the third cascode p-type transistor between the regulated voltage and the negative charge pump voltage. In accordance with several embodiments, the level shifter further includes a fourth level shifting n-type transistor and a second cascode n-type transistor in series between the negative charge pump voltage and the second output, and a second level shifting p-type transistor and a fourth cascode p-type transistor in series between the positive charge pump voltage and the second output. According to various embodiments, the radio frequency switch system further includes a first enable level shifting circuit configured to level shift the first switch enable signal to generate a first level shifted switch enable signal that controls a gate of the second level shifting p-type transistor, and a second enable level shifting circuit configured to level shift the second switch enable signal to generate a second level shifted switch enable signal that controls a gate of the first level shifting p-type transistor. In accordance with a number of embodiments, a gate of the first cascode p-type transistor and a gate of the fourth cascode p-type transistor are connected to a ground voltage. According to several embodiments, a gate of the second level shifting n-type transistor and a gate of the fourth level shifting n-type transistor are connected to a drain of the third level shifting n-type transistor, and the gate of the first level shifting n-type transistor and a gate of the third level shifting n-type transistor are connected to a drain of the second level shifting n-type transistor. In accordance with various embodiments, the radio frequency switch includes a series transistor switch electrically connected between an input terminal and an output terminal and controlled by the first switch control signal, and a shunt transistor switch electrically connected between the input terminal and a ground voltage and controlled by the second switch control signal.

In several embodiments, the radio frequency switch system further includes a charge pump clock generator including a multi-phase oscillator configured to generate a plurality of oscillator clock signals, and a clock phase logic and combining circuit configured to process the plurality of oscillator clock signals to generate a first clock signal of higher frequency than an oscillation frequency of the multi-phase oscillator, the first clock signal operable to control at least one of the positive charge pump or the negative charge pump. According to a number of embodiments, the clock phase logic and combining circuit is further configured to generate a second clock signal offset in phase from the first clock signal, the first clock signal operable to control the positive charge pump and the second clock signal operable to control the negative charge pump.

In various embodiments, the voltage regulator is a low dropout regulator.

In certain embodiments, the present disclosure relates to a level shifter for a radio frequency switch. The level shifter includes a first level-shifting n-type transistor, a first cascode n-type transistor in series with the first level-shifting n-type transistor between a negative charge pump voltage and a first output that provides a first switch control signal, a first level-shifting p-type transistor, a first cascode p-type transistor in series with the first level-shifting p-type transistor between a positive charge pump voltage and the first output, and a second cascode p-type transistor between a regulated voltage and a gate of the first level-shifting n-type transistor and controlled by a first switch enable signal.

In several embodiments, the level shifter further includes a second level shifting n-type transistor in series with the second cascode p-type transistor between the regulated voltage and the negative charge pump voltage, a third cascode p-type transistor, and a third level shifting n-type transistor in series with the third cascode p-type transistor between the regulated voltage and the negative charge pump voltage. According to a number of embodiments, the level shifter further includes a fourth level shifting n-type transistor and a second cascode n-type transistor in series between a second output and the negative charge pump voltage, and a second level shifting p-type transistor and a fourth cascode p-type transistor in series between the positive charge pump voltage and the second output. In accordance with various embodiments, the level shifter further includes a first enable level shifting circuit configured to level shift the first switch enable signal to generate a first level shifted switch enable signal that controls a gate of the second level shifting p-type transistor, and a second enable level shifting circuit configured to level shift a second switch enable signal to generate a second level shifted switch enable signal that controls a gate of the first level shifting p-type transistor. According to several embodiments, a gate of the first cascode p-type transistor and a gate of the fourth cascode p-type transistor are connected to a ground voltage. In accordance with a number of embodiments, a gate of the second level shifting n-type transistor and a gate of the fourth level shifting n-type transistor are connected to a drain of the third level shifting n-type transistor, and the gate of the first level shifting n-type transistor and a gate of the third level shifting n-type transistor are connected to a drain of the second level shifting n-type transistor.

DETAILED DESCRIPTION OF EMBODIMENTS

Figure 1:
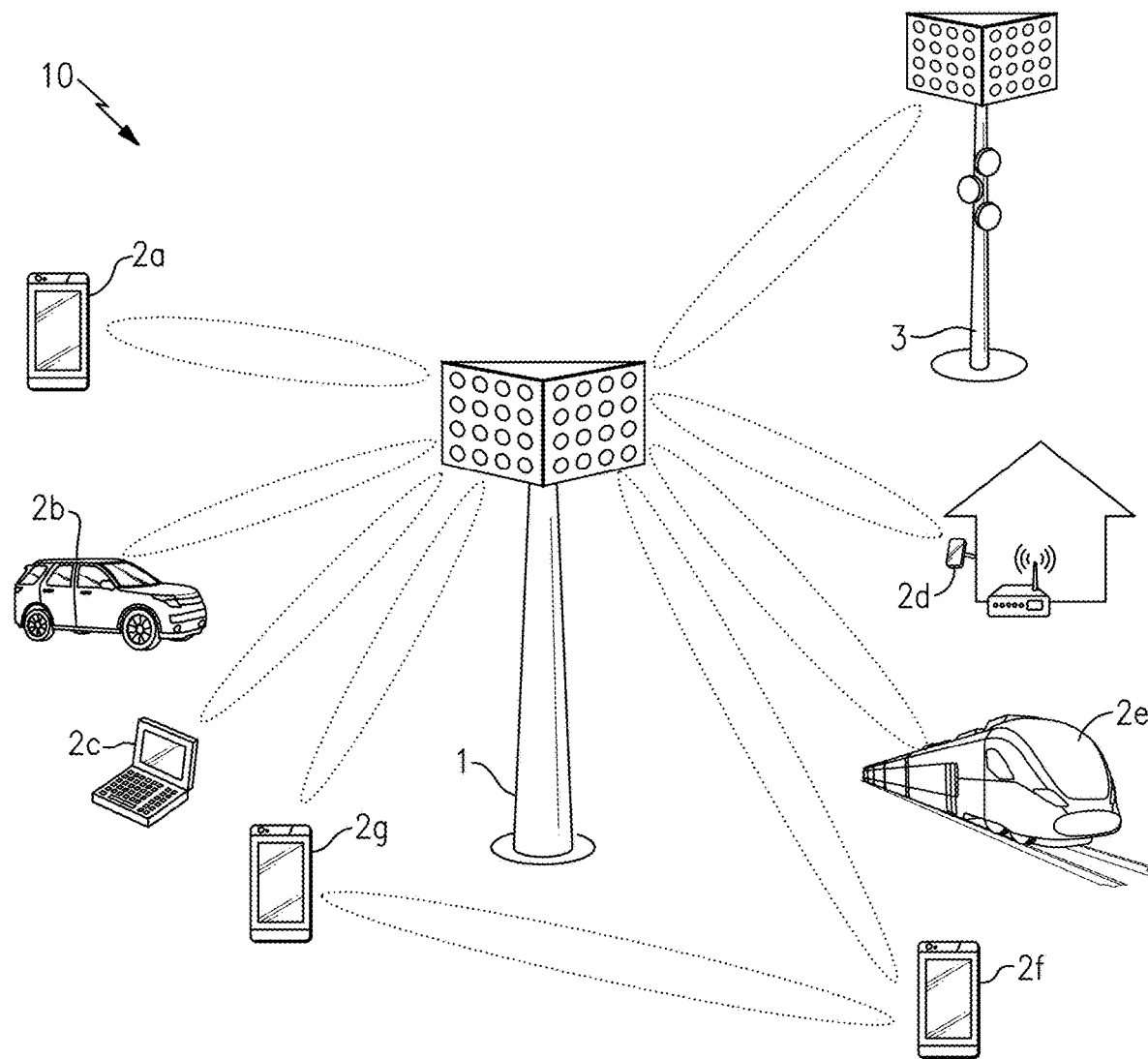
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and introduced Phase 2 of 5G technology in Release 16. Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, a second mobile device 2f, and a third mobile device 2g.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 10 can be implemented to support self-fronthaul and/or self-backhaul.

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof.

For example, 5G NR can operate with different specifications across frequency bands for 5G, including with flexible numerology compared with fixed numerology for 4G. FR1 (400 MHz to 7125 MHz) bands operate with numerology subcarrier spacing of 15 kHz, 30 kHz and 60 kHz. Additionally, FR2 includes FR2-1 (24 GHz to 52 GHz) and FR2-2 (52 GHz to 71 GHz) and operates with numerology subcarrier spacing of 60 kHz, 120 kHz and 240 kHz to be able to handle higher phase noise and Doppler effects (for instance, for train applications up to 500 km/h).

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz. In one embodiment, one or more of the mobile devices support a HPUE power class specification.

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

Figure 2A:
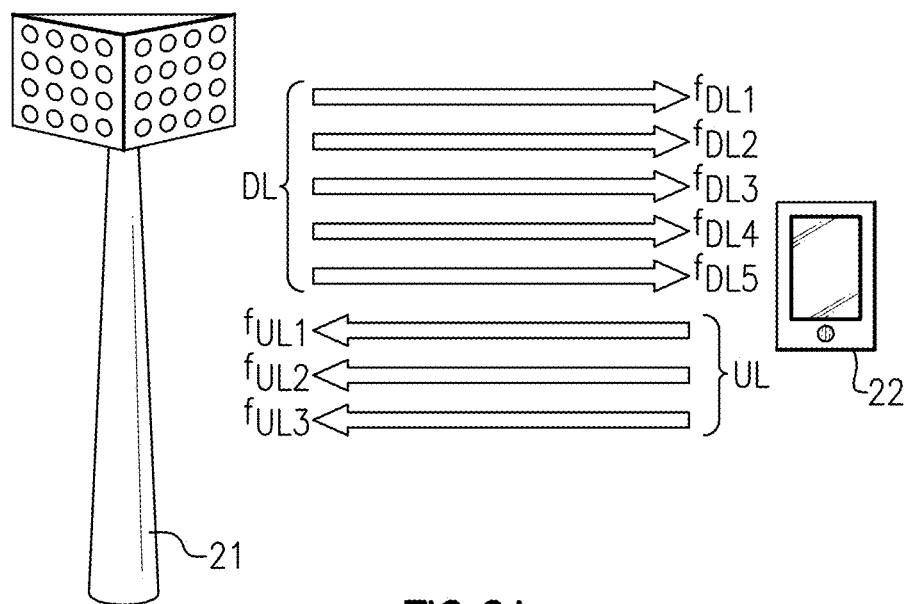
FIG. 2A is a schematic diagram of one example of a communication link using carrier aggregation.

FIG. 2A is a schematic diagram of one example of a communication link using carrier aggregation. Carrier aggregation can be used to widen bandwidth of the communication link by supporting communications over multiple frequency carriers, thereby increasing user data rates and enhancing network capacity by utilizing fragmented spectrum allocations.

In the illustrated example, the communication link is provided between a base station 21 and a mobile device 22. As shown in FIG. 2A, the communications link includes a downlink channel used for RF communications from the base station 21 to the mobile device 22, and an uplink channel used for RF communications from the mobile device 22 to the base station 21.

Although FIG. 2A illustrates carrier aggregation in the context of FDD communications, carrier aggregation can also be used for TDD communications.

In certain implementations, a communication link can provide asymmetrical data rates for a downlink channel and an uplink channel. For example, a communication link can be used to support a relatively high downlink data rate to enable high speed streaming of multimedia content to a mobile device, while providing a relatively slower data rate for uploading data from the mobile device to the cloud.

In the illustrated example, the base station 21 and the mobile device 22 communicate via carrier aggregation, which can be used to selectively increase bandwidth of the communication link. Carrier aggregation includes contiguous aggregation, in which contiguous carriers within the same operating frequency band are aggregated. Carrier aggregation can also be non-contiguous, and can include carriers separated in frequency within a common band or in different bands.

In the example shown in FIG. 2A, the uplink channel includes three aggregated component carriers $f_{UL1}$, $f_{UL2}$, and $f_{UL3}$. Additionally, the downlink channel includes five aggregated component carriers $f_{DL1}$, $f_{DL2}$, $f_{DL3}$, $f_{DL4}$, and $f_{DL5}$. Although one example of component carrier aggregation is shown, more or fewer carriers can be aggregated for uplink and/or downlink. Moreover, a number of aggregated carriers can be varied over time to achieve desired uplink and downlink data rates.

For example, a number of aggregated carriers for uplink and/or downlink communications with respect to a particular mobile device can change over time. For example, the number of aggregated carriers can change as the device moves through the communication network and/or as network usage changes over time.

Figure 2B:
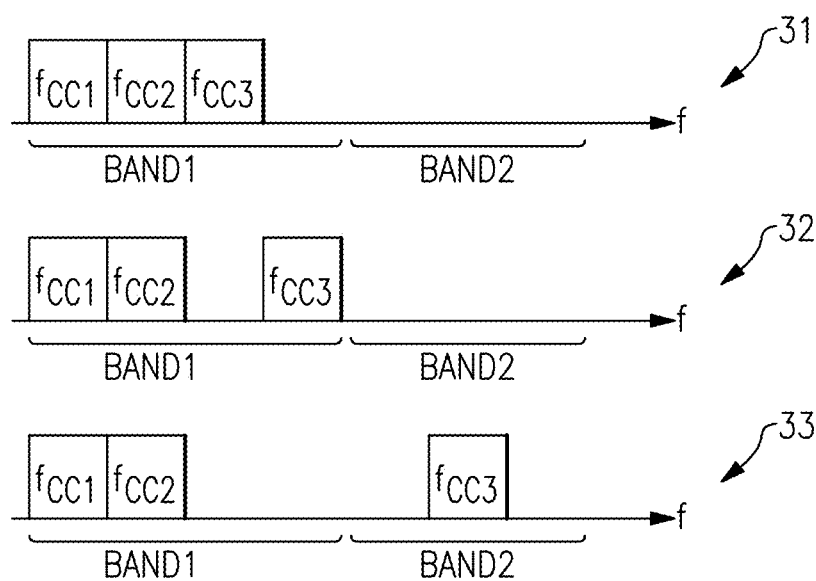
FIG. 2B illustrates various examples of uplink carrier aggregation for the communication link of FIG. 2A.

FIG. 2B illustrates various examples of uplink carrier aggregation for the communication link of FIG. 2A. FIG. 2B includes a first carrier aggregation scenario 31, a second carrier aggregation scenario 32, and a third carrier aggregation scenario 33, which schematically depict three types of carrier aggregation.

The carrier aggregation scenarios 31-33 illustrate different spectrum allocations for a first component carrier $f_{UL1}$, a second component carrier $f_{UL2}$, and a third component carrier $f_{UL3}$. Although FIG. 2B is illustrated in the context of aggregating three component carriers, carrier aggregation can be used to aggregate more or fewer carriers. Moreover, although illustrated in the context of uplink, the aggregation scenarios are also applicable to downlink.

The first carrier aggregation scenario 31 illustrates intra-band contiguous carrier aggregation, in which component carriers that are adjacent in frequency and in a common frequency band are aggregated. For example, the first carrier aggregation scenario 31 depicts aggregation of component carriers $f_{UL1}$, $f_{UL2}$, and $f_{UL3}$ that are contiguous and located within a first frequency band BAND1.

With continuing reference to FIG. 2B, the second carrier aggregation scenario 32 illustrates intra-band non-continuous carrier aggregation, in which two or more components carriers that are non-adjacent in frequency and within a common frequency band are aggregated. For example, the second carrier aggregation scenario 32 depicts aggregation of component carriers $f_{UL1}$, $f_{UL2}$, and $f_{UL3}$ that are non-contiguous, but located within a first frequency band BAND1.

The third carrier aggregation scenario 33 illustrates inter-band non-contiguous carrier aggregation, in which component carriers that are non-adjacent in frequency and in multiple frequency bands are aggregated. For example, the third carrier aggregation scenario 33 depicts aggregation of component carriers $f_{UL1}$ and $f_{UL2}$ of a first frequency band BAND1 with component carrier $f_{UL3}$ of a second frequency band BAND2.

Figure 2C:
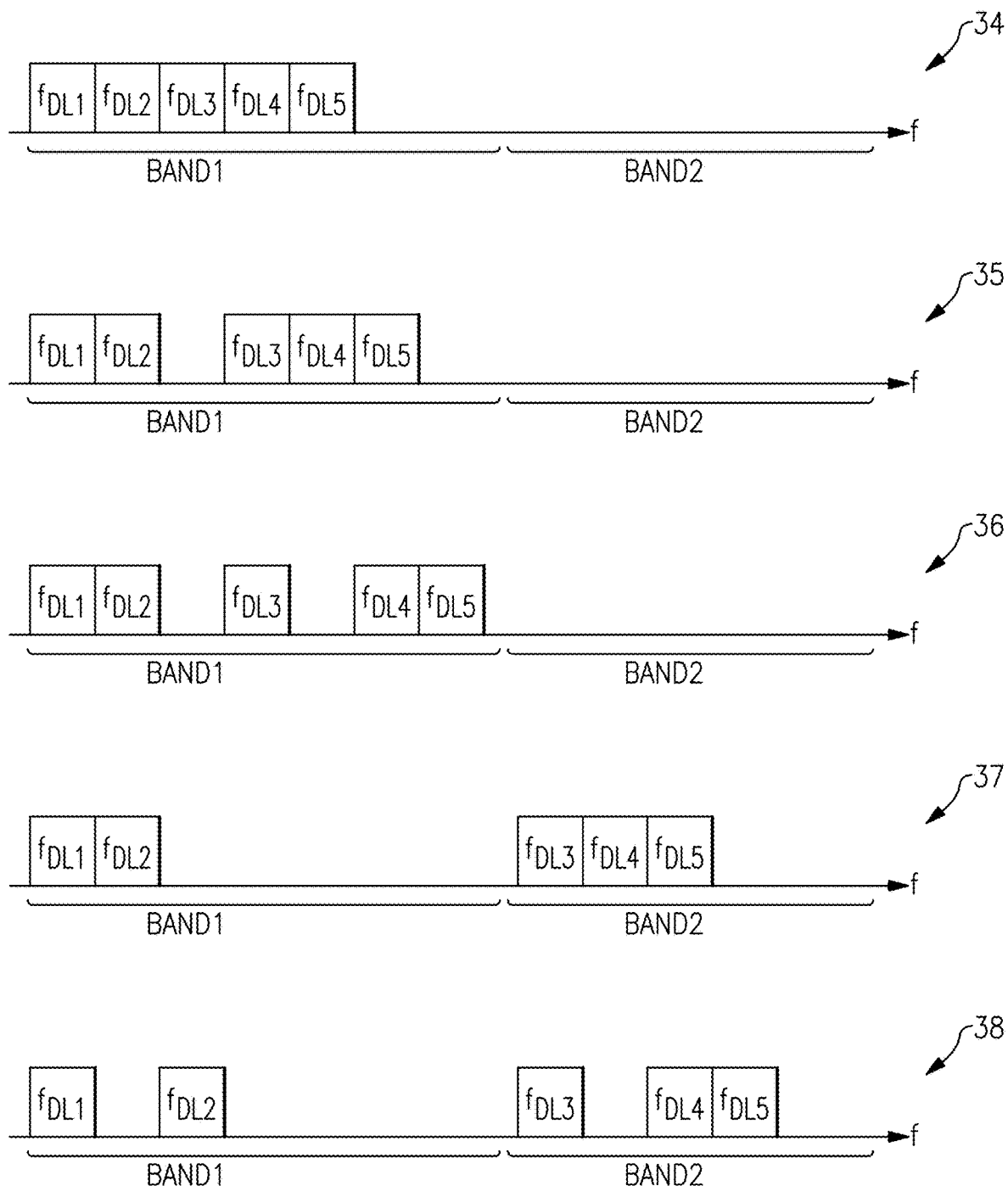
FIG. 2C illustrates various examples of downlink carrier aggregation for the communication link of FIG. 2A.

FIG. 2C illustrates various examples of downlink carrier aggregation for the communication link of FIG. 2A. The examples depict various carrier aggregation scenarios 34-38 for different spectrum allocations of a first component carrier $f_{DL1}$, a second component carrier $f_{DL2}$, a third component carrier $f_{DL3}$, a fourth component carrier $f_{DL4}$, and a fifth component carrier $f_{DL5}$. Although FIG. 2C is illustrated in the context of aggregating five component carriers, carrier aggregation can be used to aggregate more or fewer carriers. Moreover, although illustrated in the context of downlink, the aggregation scenarios are also applicable to uplink.

The first carrier aggregation scenario 34 depicts aggregation of component carriers that are contiguous and located within the same frequency band. Additionally, the second carrier aggregation scenario 35 and the third carrier aggregation scenario 36 illustrates two examples of aggregation that are non-contiguous, but located within the same frequency band. Furthermore, the fourth carrier aggregation scenario 37 and the fifth carrier aggregation scenario 38 illustrates two examples of aggregation in which component carriers that are non-adjacent in frequency and in multiple frequency bands are aggregated. As a number of aggregated component carriers increases, a complexity of possible carrier aggregation scenarios also increases.

With reference to FIGS. 2A-2C, the individual component carriers used in carrier aggregation can be of a variety of frequencies, including, for example, frequency carriers in the same band or in multiple bands. Additionally, carrier aggregation is applicable to implementations in which the individual component carriers are of about the same bandwidth as well as to implementations in which the individual component carriers have different bandwidths.

Certain communication networks allocate a particular user device with a primary component carrier (PCC) or anchor carrier for uplink and a PCC for downlink. Additionally, when the mobile device communicates using a single frequency carrier for uplink or downlink, the user device communicates using the PCC. To enhance bandwidth for uplink communications, the uplink PCC can be aggregated with one or more uplink secondary component carriers (SCCs). Additionally, to enhance bandwidth for downlink communications, the downlink PCC can be aggregated with one or more downlink SCCs.

In certain implementations, a communication network provides a network cell for each component carrier. Additionally, a primary cell can operate using a PCC, while a secondary cell can operate using a SCC. The primary and second cells may have different coverage areas, for instance, due to differences in frequencies of carriers and/or network environment.

License assisted access (LAA) refers to downlink carrier aggregation in which a licensed frequency carrier associated with a mobile operator is aggregated with a frequency carrier in unlicensed spectrum, such as WiFi. LAA employs a downlink PCC in the licensed spectrum that carries control and signaling information associated with the communication link, while unlicensed spectrum is aggregated for wider downlink bandwidth when available. LAA can operate with dynamic adjustment of secondary carriers to avoid WiFi users and/or to coexist with WiFi users. Enhanced license assisted access (eLAA) refers to an evolution of LAA that aggregates licensed and unlicensed spectrum for both downlink and uplink. Furthermore, NR-U can operate on top of LAA/eLAA over a 5 GHz band (5150 to 5925 MHz) and/or a 6 GHz band (5925 MHz to 7125 MHz).

Figure 3A:
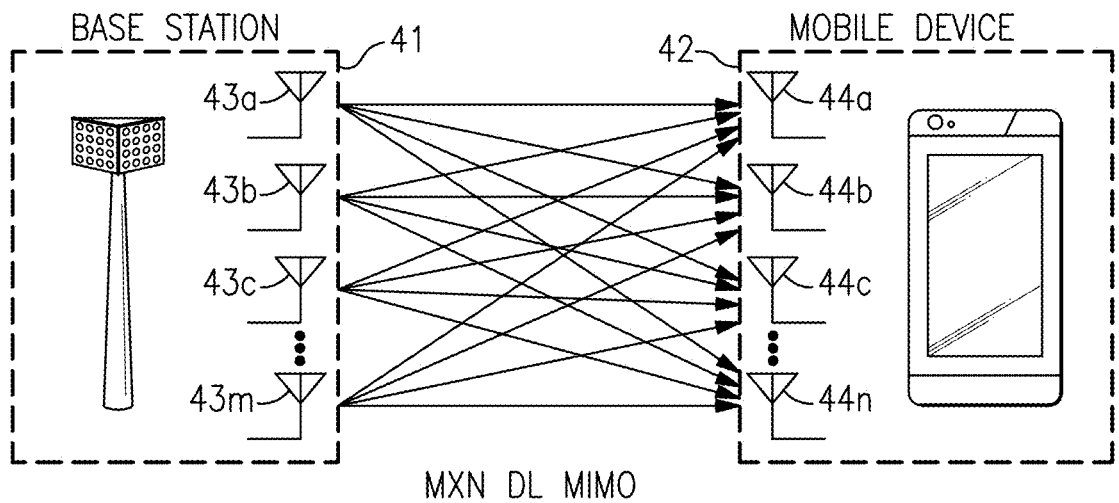
FIG. 3A is a schematic diagram of one example of a downlink channel using multi-input and multi-output (MIMO) communications.
Figure 3B:
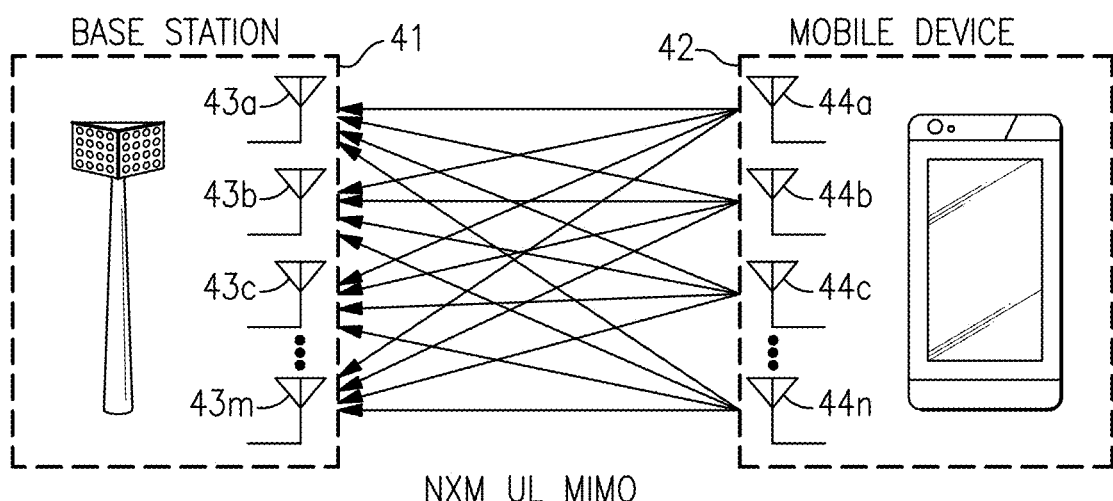
FIG. 3B is schematic diagram of one example of an uplink channel using MIMO communications.

FIG. 3A is a schematic diagram of one example of a downlink channel using multi-input and multi-output (MIMO) communications. FIG. 3B is schematic diagram of one example of an uplink channel using MIMO communications.

MIMO communications use multiple antennas for simultaneously communicating multiple data streams over common frequency spectrum. In certain implementations, the data streams operate with different reference signals to enhance data reception at the receiver. MIMO communications benefit from higher SNR, improved coding, and/or reduced signal interference due to spatial multiplexing differences of the radio environment.

MIMO order refers to a number of separate data streams sent or received. For instance, MIMO order for downlink communications can be described by a number of transmit antennas of a base station and a number of receive antennas for UE, such as a mobile device. For example, two-by-two (2×2) DL MIMO refers to MIMO downlink communications using two base station antennas and two UE antennas. Additionally, four-by-four (4×4) DL MIMO refers to MIMO downlink communications using four base station antennas and four UE antennas.

In the example shown in FIG. 3A, downlink MIMO communications are provided by transmitting using M antennas 43a, 43b, 43c, . . . 43m of the base station 41 and receiving using N antennas 44a, 44b, 44c, . . . 44n of the mobile device 42. Accordingly, FIG. 3A illustrates an example of m×n DL MIMO.

Likewise, MIMO order for uplink communications can be described by a number of transmit antennas of UE, such as a mobile device, and a number of receive antennas of a base station. For example, 2×2 UL MIMO refers to MIMO uplink communications using two UE antennas and two base station antennas. Additionally, 4×4 UL MIMO refers to MIMO uplink communications using four UE antennas and four base station antennas.

In the example shown in FIG. 3B, uplink MIMO communications are provided by transmitting using N antennas 44a, 44b, 44c, . . . 44n of the mobile device 42 and receiving using M antennas 43a, 43b, 43c, . . . 43m of the base station 41. Accordingly, FIG. 3B illustrates an example of n×m UL MIMO.

By increasing the level or order of MIMO, data bandwidth of an uplink channel and/or a downlink channel can be increased.

MIMO communications are applicable to communication links of a variety of types, such as FDD communication links and TDD communication links.

Figure 3C:
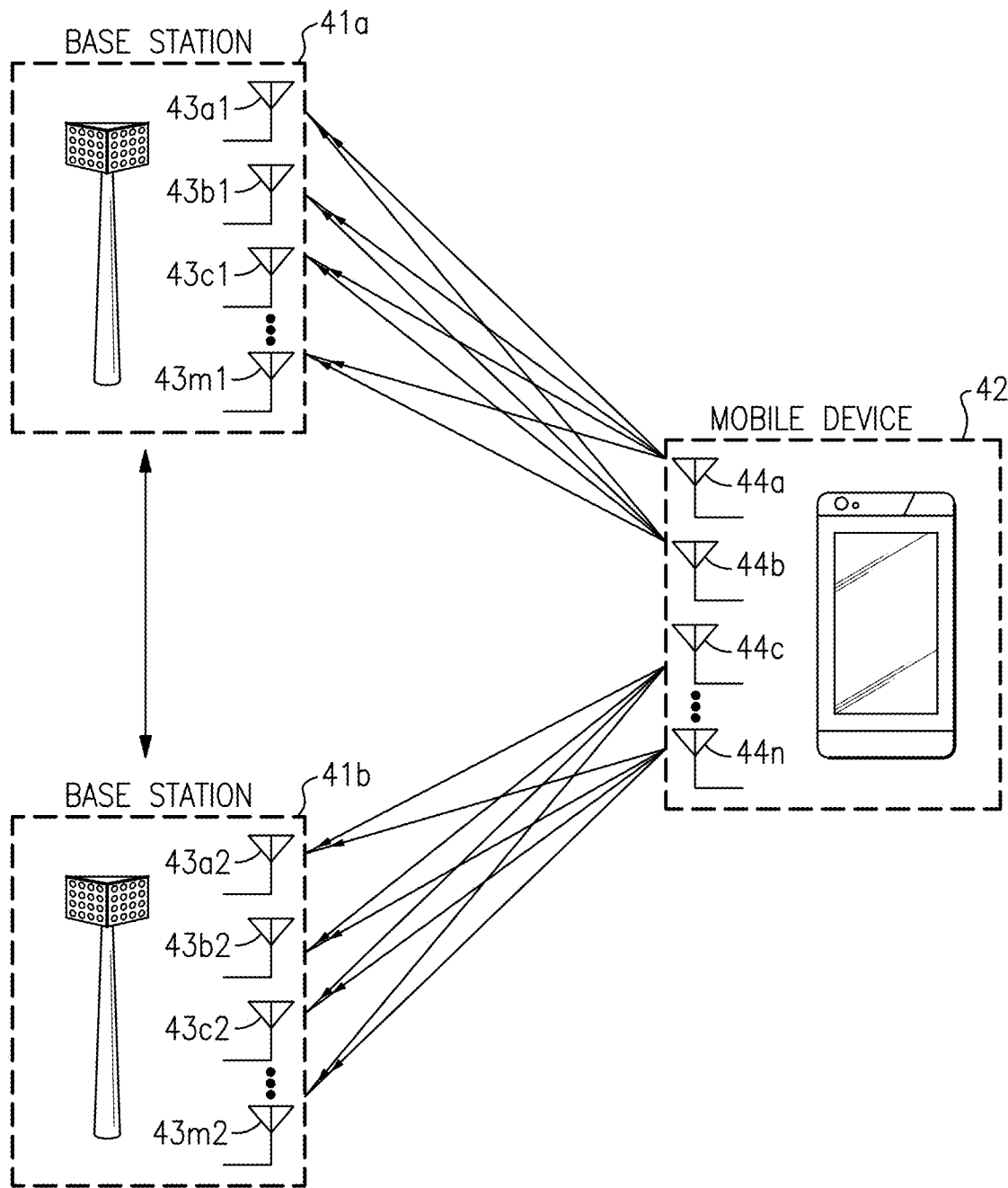
FIG. 3C is schematic diagram of another example of an uplink channel using MIMO communications.

FIG. 3C is schematic diagram of another example of an uplink channel using MIMO communications. In the example shown in FIG. 3C, uplink MIMO communications are provided by transmitting using N antennas 44a, 44b, 44c, . . . 44n of the mobile device 42. Additional a first portion of the uplink transmissions are received using M antennas 43a1, 43b1, 43c1, . . . 43m1 of a first base station 41a, while a second portion of the uplink transmissions are received using M antennas 43a2, 43b2, 43c2, . . . 43m2 of a second base station 41b. Additionally, the first base station 41a and the second base station 41b communication with one another over wired, optical, and/or wireless links.

The MIMO scenario of FIG. 3C illustrates an example in which multiple base stations cooperate to facilitate MIMO communications.

Figure 4:
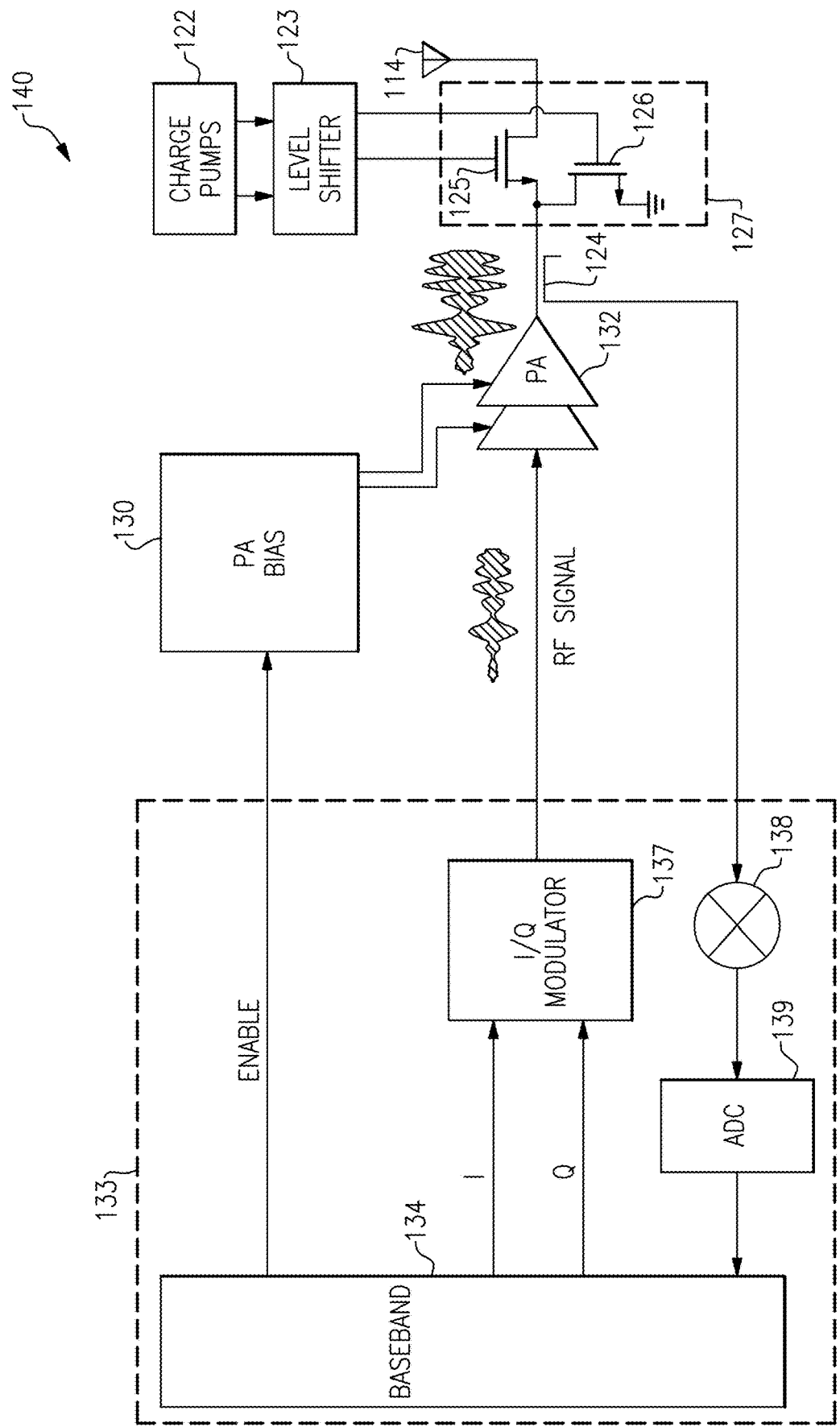
FIG. 4 is a schematic block diagram of one embodiment of a power amplifier system.

FIG. 4 is a schematic block diagram of one embodiment of a power amplifier system 140. The illustrated power amplifier system 140 includes an RF switching circuit 127 that includes a series switch transistor 125 and a shunt switch transistor 126. The illustrated power amplifier system 140 further includes charge pumps 122, a level shifter 123, a directional coupler 124, a power amplifier bias circuit 130, a power amplifier 132, and a transmitter 133. The illustrated transmitter 133 includes a baseband processor 134, an I/Q modulator 137, a mixer 138, and an analog-to-digital converter (ADC) 139. Although not illustrated in FIG. 4 for clarity, the transmitter 133 can include circuitry associated with receiving signals over one or more receive paths such that transceiver functionality is achieved.

The baseband signal processor 134 can be used to generate an in-phase (I) signal and a quadrature-phase (Q) signal, which can be used to represent a sinusoidal wave or signal of a desired amplitude, frequency, and phase. For example, the I signal can be used to represent an in-phase component of the sinusoidal wave and the Q signal can be used to represent a quadrature component of the sinusoidal wave, which can be an equivalent representation of the sinusoidal wave. In certain implementations, the I and Q signals can be provided to the I/Q modulator 137 in a digital format. The baseband processor 134 can be any suitable processor configured to process a baseband signal. For instance, the baseband processor 134 can include a digital signal processor, a microprocessor, a programmable core, or any combination thereof. Moreover, in some implementations, two or more baseband processors 134 can be included in the power amplifier system 140.

The I/Q modulator 137 can be configured to receive the I and Q signals from the baseband processor 134 and to process the I and Q signals to generate an RF signal. For example, the I/Q modulator 137 can include DACs configured to convert the I and Q signals into an analog format, mixers for upconverting the I and Q signals to radio frequency, and a signal combiner for combining the upconverted I and Q signals into an RF signal suitable for amplification by the power amplifier 132. In certain implementations, the I/Q modulator 137 can include one or more filters configured to filter frequency content of signals processed therein.

The power amplifier bias circuit 130 can receive one or more control signals from the baseband processor 134, which can be used to generate one or more bias signals for the power amplifier 132. The control signals can include, for example, bias settings or levels and/or enable functionality. The power amplifier 132 can receive the RF signal from the I/Q modulator 137 of the transmitter 133.

The level shifter 123 can turn on and off the series switch transistor 125 and the shunt switch transistor 126 in a complementary manner. For example, the level shifter 123 can be used to turn on the series switch transistor 125 and turn off the shunt switch transistor 126 such that the power amplifier 132 provides an amplified RF signal to the antenna 114 through the series switch transistor 125. Additionally, the level shifter 123 can be used to turn off the series switch transistor 125 and turn on the shunt switch transistor 126 to provide a high impedance path between the output of the power amplifier 132 and the antenna 114 while providing termination to the power amplifier's output. To control a state of the RF switching circuit 127, the level shifter 123 can receive a switch enable signal (not illustrated in FIG. 4) from any suitable circuitry, such as the transmitter 133.

The directional coupler 124 can be positioned between the output of the power amplifier 132 and the source of the series switch transistor 125, thereby allowing an output power measurement of the power amplifier 132 that does not include insertion loss of the series switch transistor 125. The sensed output signal from the directional coupler 124 can be provided to the mixer 138, which can multiply the sensed output signal by a reference signal of a controlled frequency so as to downshift the frequency content of the sensed output signal to generate a downshifted signal. The downshifted signal can be provided to the ADC 139, which can convert the downshifted signal to a digital format suitable for processing by the baseband processor 134.

By including a feedback path between the output of the power amplifier 132 and the baseband processor 134, the baseband processor 134 can be configured to dynamically adjust the I and Q signals to optimize the operation of the power amplifier system 140. For example, configuring the power amplifier system 140 in this manner can aid in controlling the power added efficiency (PAE) and/or linearity of the power amplifier 132.

In the illustrated configuration, the charge pumps 122 provide a positive charge pump voltage and a negative charge pump voltage to the level shifter 123. In certain configurations (for instance, when the switches are implemented using n-type transistors), the positive charge pump voltage is used to bias the gate voltage of the series switch transistor 125 and/or the shunt switch transistor 126 when turned on, while the negative charge pump voltage is used to bias the gate voltage of the series switch transistor 125 and/or the shunt switch transistor 126 when turned off.

Although the series switch transistor 125 and the shunt switch transistor 126 are each depicted as a single transistor, typically a stack of transistors is used to implement each of the series switch transistor 125 and the shunt switch transistor 126. For example, stacking transistors aids in meeting a desired power handling capability. Furthermore, certain biasing details of the series switch transistor 125 and the shunt switch transistor 126, such as gate resistors and other biasing, are not depicted in FIG. 4 for clarity of the drawing.

Figure 5A:
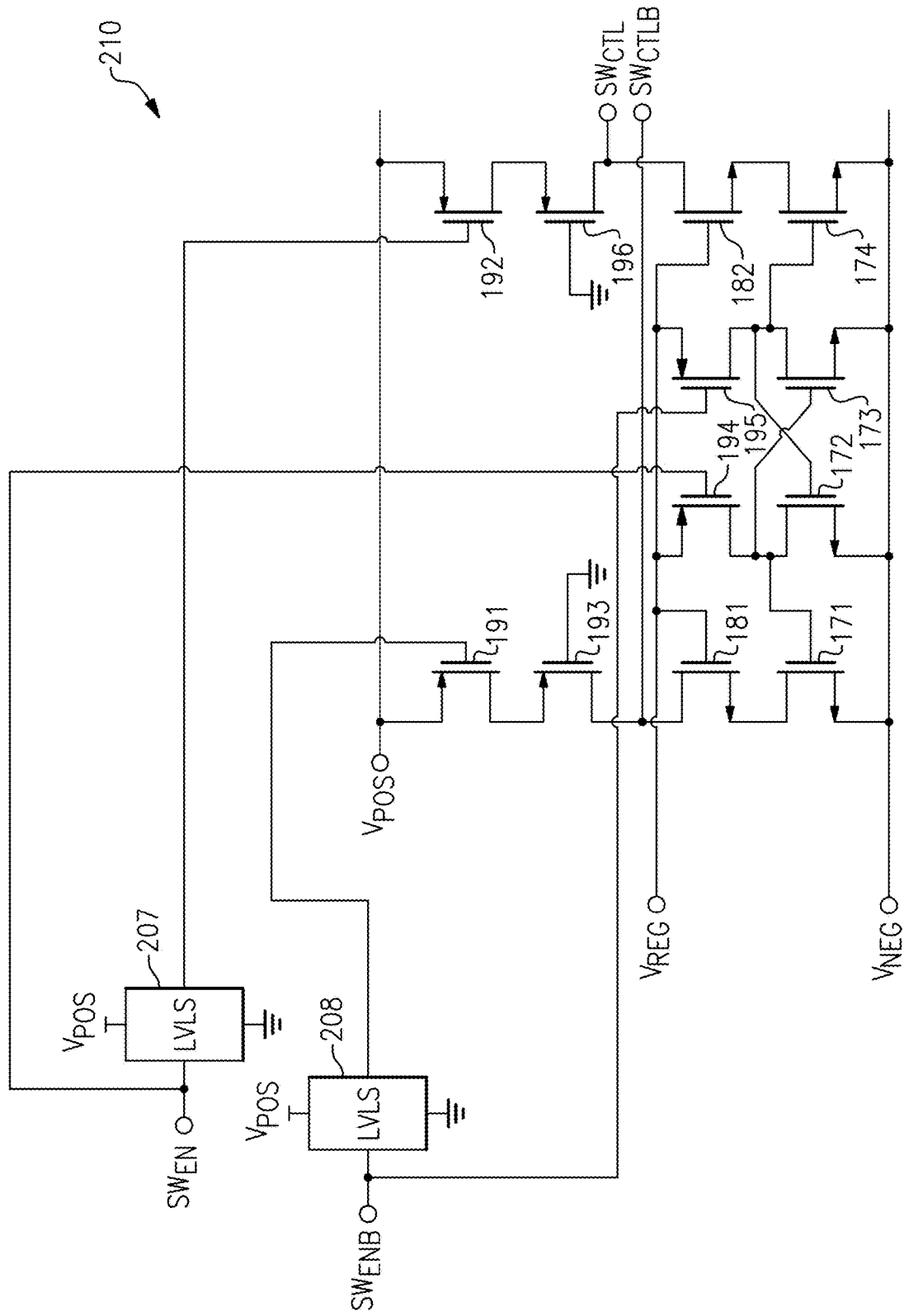
FIG. 5A is a schematic diagram of one embodiment of a level shifter.

FIG. 5A is a circuit diagram of one embodiment of a level shifter 210. The level shifter 210 includes a first n-type metal oxide semiconductor (NMOS) level-shifting transistor 171, a second NMOS level-shifting transistor 172, a third NMOS level-shifting transistor 173, a fourth NMOS level-shifting transistor 174, a first NMOS cascode transistor 181, a second NMOS cascode transistor 182, a first p-type metal oxide semiconductor (PMOS) level-shifting transistor 191, a second PMOS level-shifting transistor 192, a first PMOS cascode transistor 193, a second PMOS cascode transistor 194, a third PMOS cascode transistor 195, a fourth PMOS cascode transistor 196, a first enable level shifter 207, and a second enable level shifter 208.

In the illustrated embodiment, the level shifter 210 receives a switch enable signal $SW_{EN}$, an inverted switch enable signal $SW_{ENB}$, a regulated voltage $V_{REG}$ (from a voltage regulator, such as a low dropout regulator), a negative charge pump voltage $V_{NEG}$ (from a negative charge pump), and a positive charge pump voltage $V_{POS}$ (from a positive charge pump). The level shifter 210 includes a non-inverted switch control output $SW_{CTL}$ and an inverted switch control output $SW_{CTLB}$ for generating switch controls signals of complementary polarity for controlling an RF switching circuit (for instance, one for controlling a series switch and another for controlling a shunt switch as in the configuration of FIG. 4). Although both outputs are used in certain applications, in other implementations only one of the level shifter's outputs is used.

The first enable level shifter 207 level shifts the switch enable signal $SW_{EN}$ to generate a level-shifted switch enable signal in a voltage domain of the positive charge pump (the first enable level shifter 207 and the second enable level shifter 208 are powered by $V_{POS}$ and ground). Additionally, the second enable level shifter 208 level shifts the inverted switch enable signal $SW_{ENB}$ to generate a level-shifted inverted switch enable signal in the voltage domain of the positive charge pump. Although shown as receiving a pair of switch enable signals of complementary polarity, in another embodiment the level shifter 210 receives a single switch enable signal, which can be inverted (for instance, using an inverter) to generate the pair of switch enable signals.

As shown in FIG. 5A, the first NMOS level-shifting transistor 171 and the first NMOS cascode transistor 181 are in series (from source to drain) between the negative chare pump voltage $V_{NEG}$ and the inverted switch control output $SW_{CTLB}$, while the first PMOS level-shifting transistor 191 and the first PMOS cascode transistor 193 are in series (from source to drain) between the positive charge pump voltage $V_{POS}$ and the inverted switch control output $SW_{CTLB}$. Furthermore, the fourth NMOS level-shifting transistor 174 and the second NMOS cascode transistor 182 are in series (from source to drain) between the negative charge pump voltage $V_{NEG}$ and the non-inverted switch control output $SW_{CTL}$, while the second PMOS level-shifting transistor 192 and the fourth PMOS cascode transistor 196 are in series (from source to drain) between the positive charge pump voltage $V_{POS}$ and the non-inverted switch control output $SW_{CTL}$.

In the illustrated embodiment, the gate of first NMOS level-shifting transistor 171 and the gate of the third NMOS level-shifting transistor 173 are connected to a drain of the second NMOS level-shifting transistor 172. Additionally, the gate of second NMOS level-shifting transistor 172 and the gate of the fourth NMOS level-shifting transistor 174 are connected to a drain of the third NMOS level-shifting transistor 173. The gates and drains of the second NMOS level-shifting transistor 172 and the third NMOS level-shifting transistor 173 are cross-coupled.

The gate of the first NMOS cascode transistor 181 and the gate of the second NMOS cascode transistor 182 are connected to the regulated voltage $V_{REG}$. Additionally, the gate of the second PMOS cascode transistor 194 is controlled by the switch enable signal $SW_{EN}$, while the gate of the third PMOS cascode transistor 195 is controlled by the inverted switch enable signal $SW_{ENB}$.

The gate of first PMOS cascode transistor 193 and the fourth PMOS cascode transistor 196 are grounded. Additionally, the gate of first PMOS level-shifting transistor 191 receives the level-shifted inverted switch enable signal, while the gate of the second PMOS level-shifting transistor 192 receives the level-shifted switch enable signal.

The level shifter 210 provides a number of advantages, including low current draw from the charge pump voltages $V_{POS}$ and $V_{NEG}$, low voltage headroom, and robust latching (of cross-coupled transistors 172 and 173) during low voltage operation. Moreover, the regulated voltage $V_{REG}$ is low impedance to maintain robust operation, and also is active quickly after start-up. Thus, the level shifter 210 is associated with fast start-up time, and can perform level-shifting even when the charge pump voltages $V_{POS}$ and/or $V_{NEG}$ are not at a steady-state value, such as shortly after power supply sequencing and/or start-up.

Figure 5B:
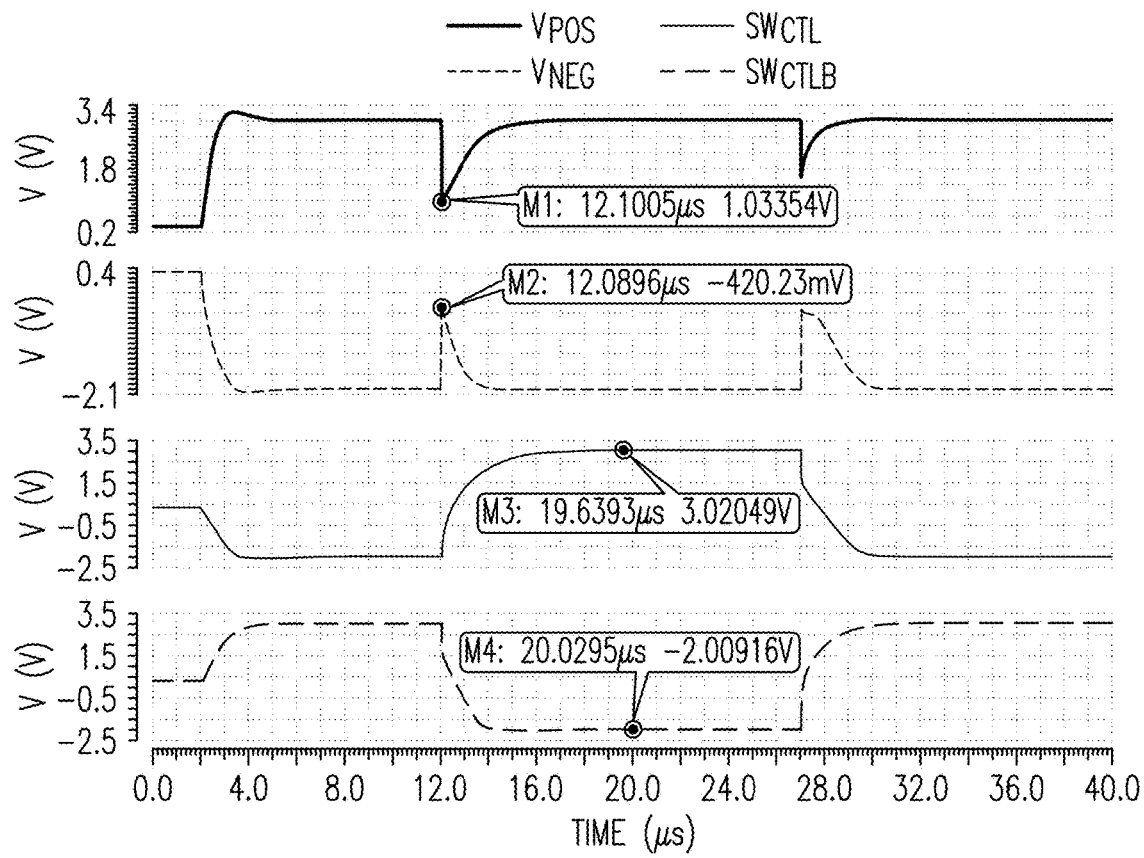
FIG. 5B is a graph of one example of waveforms for the level shifter of FIG. 5A.

FIG. 5B is a graph of one example of waveforms for the level shifter 210 of FIG. 5A. The graph includes waveforms of the positive charge pump voltage $V_{POS}$, the negative charge pump voltage $V_{NEG}$, the switch control output $SW_{CTL}$, and the inverted switch control output $SW_{CTLB}$ for an example in which the positive and negative charge pumps drive many level shifters and suffer from large current draws at certain time instances (at about 12 microseconds (μs) and 27 μs in this simulation) associated with changing the state of the switches, for instance, at end of the transmit or receive time slot in a time-division duplexing (TDD) application.

As shown in FIG. 5B, even in the presence of large current draws on the charge pump supplies, the level shifter 210 continues to properly operate.

Figure 6:
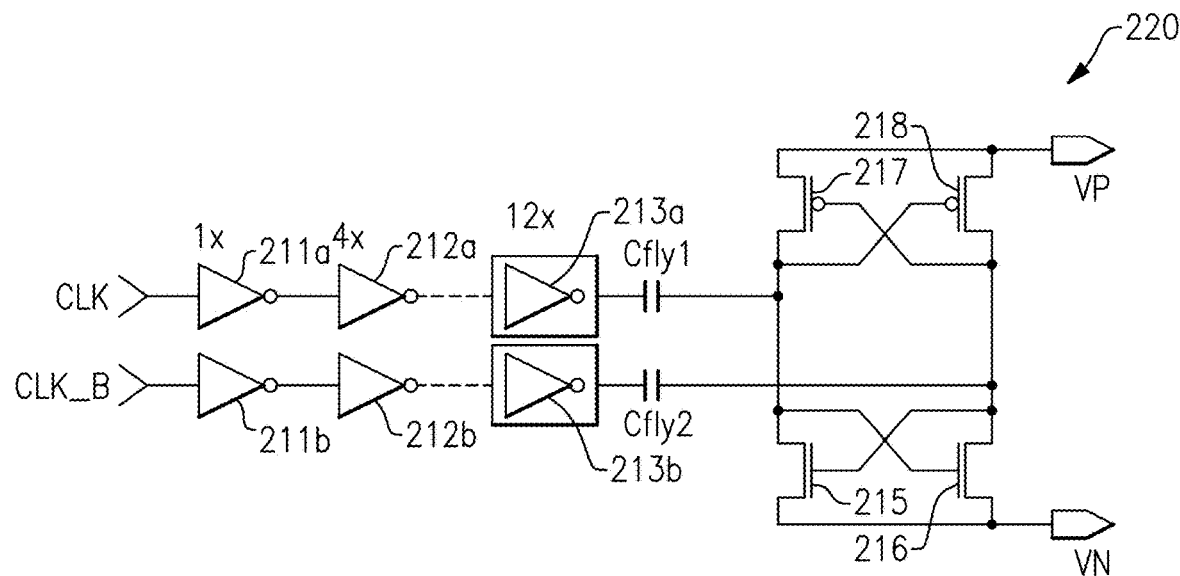
FIG. 6 is a schematic diagram of one embodiment of a charge pump.

FIG. 6 is a schematic diagram of one embodiment of a charge pump 220.

The charge pump 220 includes a first group of clock inverters 211a/212a/213a, a second group of clock inverters 211b/212b/213b, a first flying capacitor Cfly1, a second flying capacitor Cfly2, a first NMOS transistor 215, a second NMOS transistor 216, a first PMOS transistor 217, and a second PMOS transistor 218.

With continuing reference to FIG. 6, the charge pump 220 includes a first clock input CLK for receiving a non-inverted clock signal for driving the first group of clock inverters 211a/212a/213a, and a second clock input CLK_B for receiving an inverted clock signal for driving the second group of clock inverters 211b/212b/213b. The first group of clock inverters 211a/212a/213a are sized to buffer the non-inverted clock signal to provide a drive strength sufficient for driving a first end of the first flying capacitor Cfly1. Similarly, the second group of clock inverters 211b/212b/

213b are sized to buffer the inverted clock signal to provide a drive strength sufficient for driving a first end of the second flying capacitor Cfly2.

The clock inverter groups can include any suitable number of inverters, and can be scaled (1×, 4×, and 12×, in this example) in any suitable manner. Thus, although an example with three inverts with a 4× scaling is shown, more or fewer inverters and/or a different scaling can be used. In certain implementations, the buffered clock signals used to drive the flying capacitors correspond to a pair of non-overlapping clock signals.

As shown in FIG. 6, the charge pump 220 includes a first terminal VP and a second terminal VN. Based on the connectivity of the first terminal VP and the second terminal VN, the charge pump 220 can serve as either a positive charge pump (generating $V_{POS}$ at the first terminal VP with a boosted voltage relative to the second terminal VN, for instance, connected to a normal supply voltage provided to a pin of the die) or a negative charge pump (generating $V_{NEG}$ at the second terminal VN with a reduced or buck voltage relative to the first terminal VP, for instance, connected to ground).

Figure 7A:
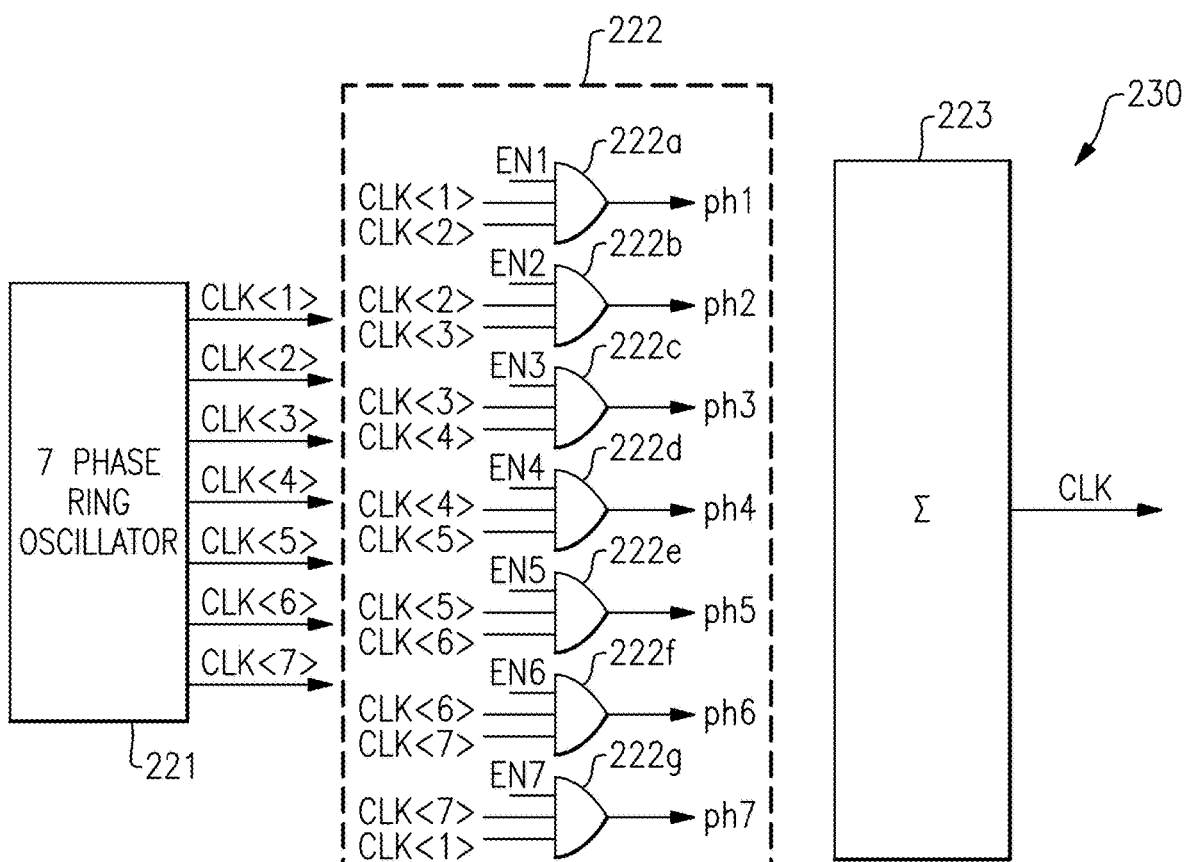
FIG. 7A is a schematic diagram of one embodiment of a charge pump clock generator.

FIG. 7A is a schematic diagram of one embodiment of a charge pump clock generator 230. The charge pump clock generator 230 includes a multi-phase oscillator (corresponding to a seven phase ring oscillator 221, in this example). The charge pump clock generator 230 further includes a clock phase logic circuit 222 (implemented as AND gates 222a, 222b, 222c, 222d, 222e, 222f, and 222g, in this example) and a clock phase combining circuit 223.

In the illustrated embodiment, the ring oscillator 221 generates clock signals clk<1>, clk<2>, clk<3>, clk<4>, clk<5>, clk<6>, and clk<7>, which are of common frequency but of different (for instance, evenly separated) phases. Additionally, the AND gates 222a, 222b, 222c, 222d, 222e, 222f, and 222g perform logical operations on adjacent clock signal phases to generate clock phase signals ph1, ph2, ph3, ph4, ph5, ph6, and ph7, which are processed by the phase combining circuit 223 to generate a clock signal CLK of multiplied frequency relative to the oscillation frequency of the ring oscillator 221.

In this example, the AND gates each operate with a respective enable signal EN1, EN2, EN3, EN4, EN5, EN6, and EN7 to selectively enable one or more of the clock phase signals ph1, ph2, ph3, ph4, ph5, ph6, and ph7, respectively.

The charge pump clock generator 230 advantageously synthesizes a clock signal of higher frequency than the oscillator 221. This in turn reduces frequency spurs and/or undesired clock noise in a charge pump output voltage (for instance, $V_{POS}$ or $V_{NEG}$) that is generated by a charge pump that uses the clock signal to control pumping.

Figure 7B:
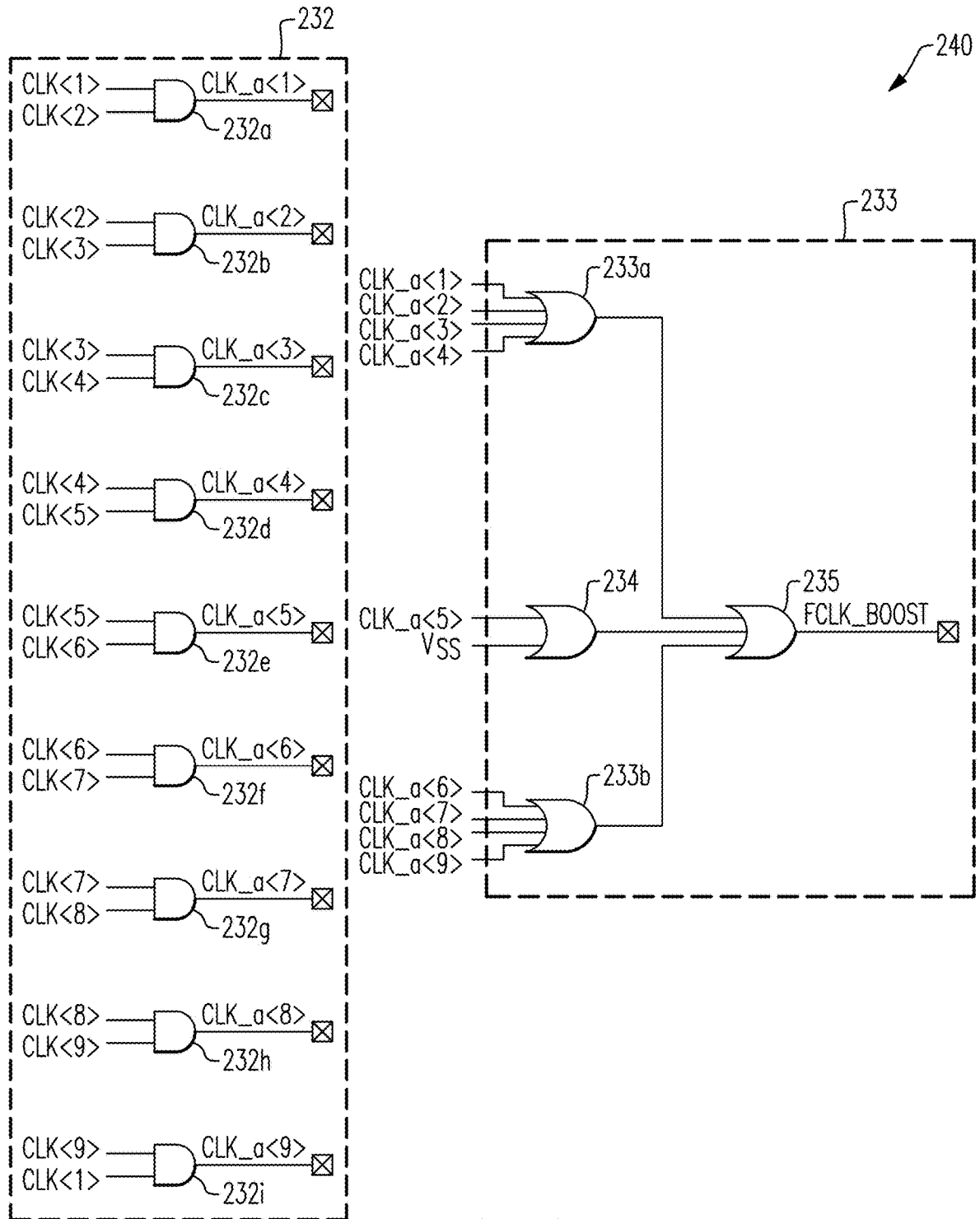
FIG. 7B is a schematic diagram of one embodiment of frequency multiplying logic for a charge pump clock generator.

FIG. 7B is a schematic diagram of one embodiment of frequency multiplying logic 240 for a charge pump clock generator. The frequency multiplying logic 240 includes a clock phase logic circuit 232 (implemented as AND gates 232a, 232b, 232c, 232d, 232e, 232f, 232g, 232h, and 232i, in this example) and a clock phase combining circuit 233 (implemented as OR gates 233a, 233b, 234, and 235, in this example).

In the illustrated embodiment, the clock phase logic circuit processes nine clock signals (CLK<1>, CLK <2>, CLK <3>, CLK <4>, CLK <5>, CLK <6>, CLK <7>, CLK <8>, and CLK <9>) from a multi-phase oscillator (for instance, a ring oscillator) to generate clock signal phases CLK_a<1>, CLK_a<2>, CLK_a<3>, CLK_a<4>, CLK_a<5>, CLK_a<6>, CLK_a<7>, CLK_a<8>, and CLK_a<9>. The phase combining circuit 233 performs a logical OR of the clock signal phases to generate a boosted clock signal FCLK_BOOST of higher frequency than that of the received clock signals from the multi-phase oscillator.

Figure 7C:
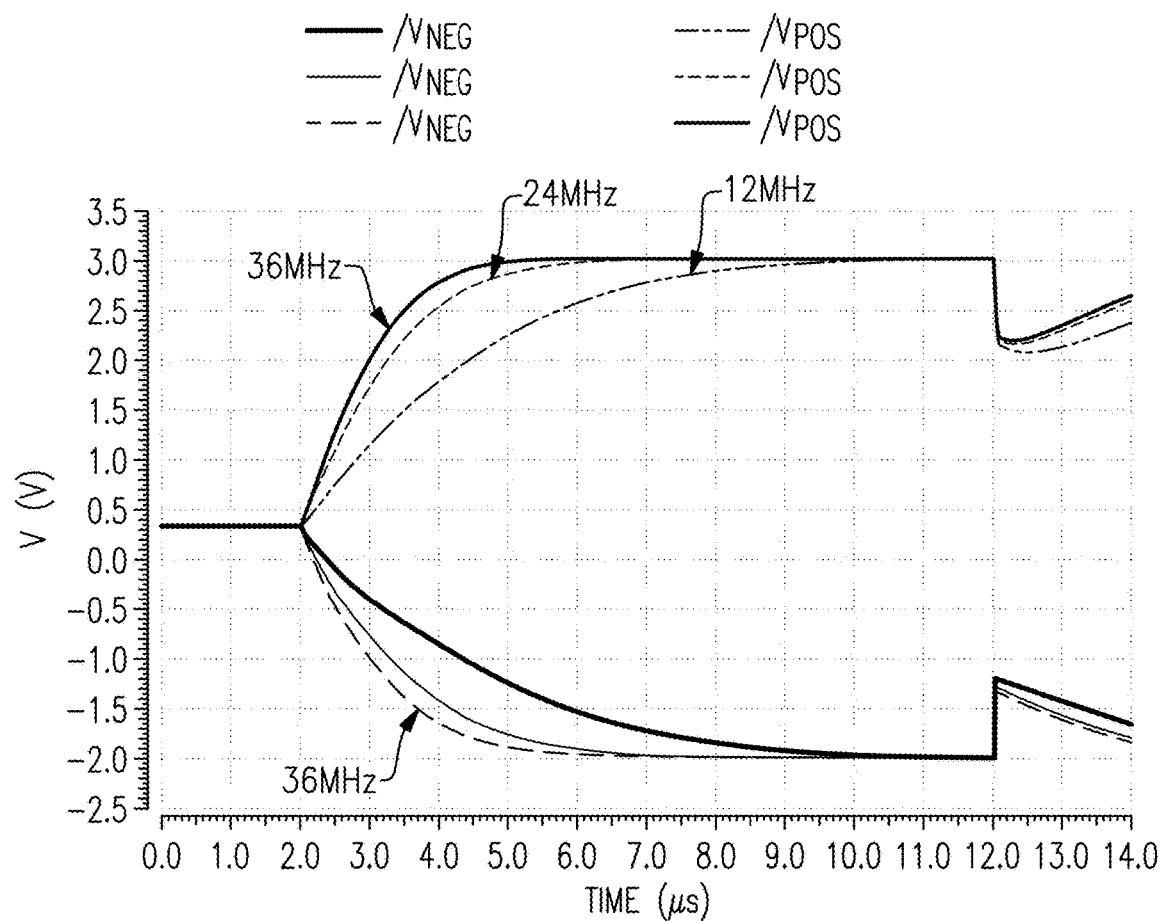
FIG. 7C is a graph of one example of waveforms for positive and negative charge pumps operating at different clock frequencies.

FIG. 7C is a graph of one example of waveforms for positive and negative charge pumps operating at different clock frequencies. As shown by the waveforms, faster clock speed is advantageous for providing a charge pump with higher output drive capability and/or initial ramp-up time.

Although fast clock speed is desirable, frequency spurs and/or undesired clock noise is introduced when using a fast oscillator. By synthesizing a faster clock signal for a charge pump using a slower running oscillator in accordance with the teachings herein, the benefits of fast pumping, small frequency spurs, and/or low clock noise are achieved.

Figure 8A:
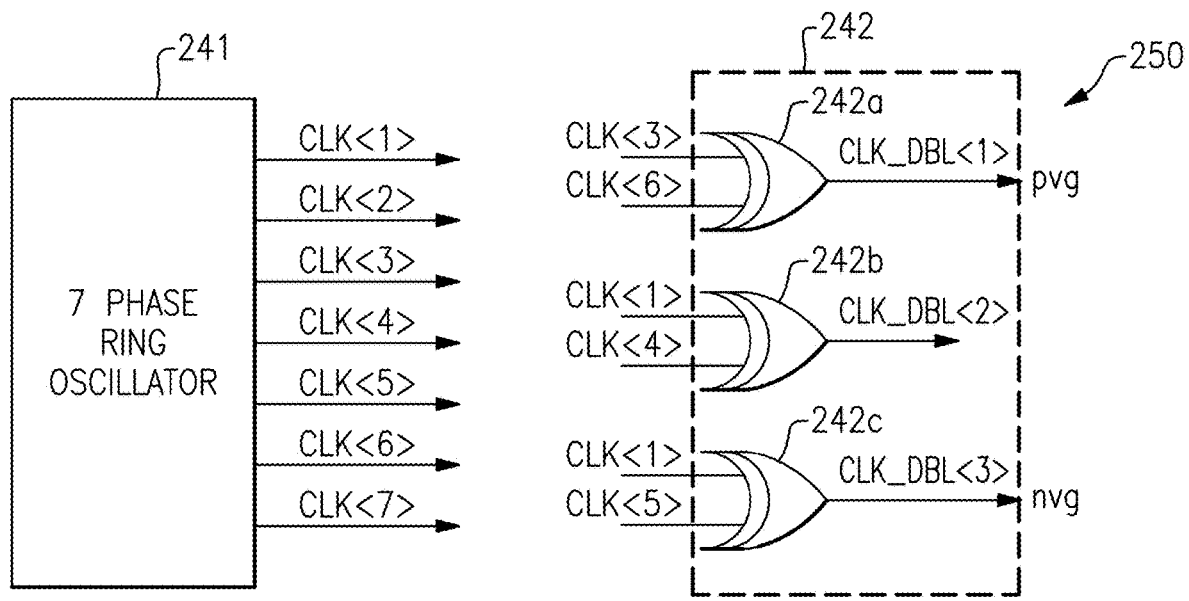
FIG. 8A is a schematic diagram of another embodiment of a charge pump clock generator.

FIG. 8A is a schematic diagram of another embodiment of a charge pump clock generator 250. The charge pump clock generator 250 includes a multi-phase oscillator (corresponding to a seven phase ring oscillator 241, in this example). The charge pump clock generator 230 further includes a clock phase logic and combining circuit 242 (implemented as exclusive OR gates 242a, 242b, and 242c, in this example).

The clock phase logic and combining circuit 242 processes the oscillator clock signals from the multi-phase oscillator to generate a first multiplied clock signal (CLK_DBL<1> or pvg) for driving a positive charge pump (for example, CLK_DBL<1> can be inverted to generate a pair of input clock signals CLK and CLKB to the charge pump 220 of FIG. 6) and a second multiplied clock signal (CLK_DBL<3> or nvg) for driving a negative charge pump.

Advantageously, the first multiplied clock signal and the second multiplied clock signal are of common frequency, but offset in phase to spread out the time instances of current draw of the positive charge pump and the negative charge pump. Thus, enhanced performance is achieved relative to a configuration in which the clock signals to the positive charge pump and the negative charge pump are of the same phase (phase-aligned).

Figure 8B:
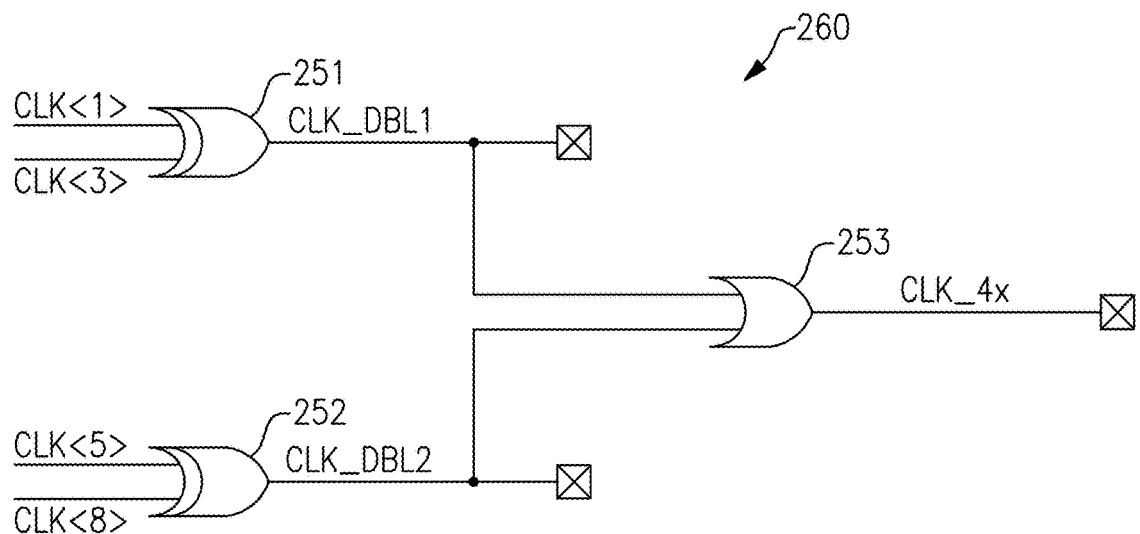
FIG. 8B is a schematic diagram of another embodiment of frequency multiplying logic for a charge pump clock generator.

FIG. 8B is a schematic diagram of another embodiment of frequency multiplying logic 260 for a charge pump clock generator. In this example, XOR gates 251 and 252 are used to process clock signal phases (CLK<1>, CLK<3>, CLK<5>, and CLK<8>) to synthesize clock signals CLK_DBL1 and CLK_DBL2, respectively, of double frequency (doubling). Additionally, OR gate 253 is used to process the clock signals CLK_DBL1 and CLK_DBL2 to generate a clock signal CLK_4× of four times the frequency (frequency quadrupling) relative to the original clock signal phases (CLK<1>, CLK<3>, CLK<5>, and CLK<8>).

Figure 8C:
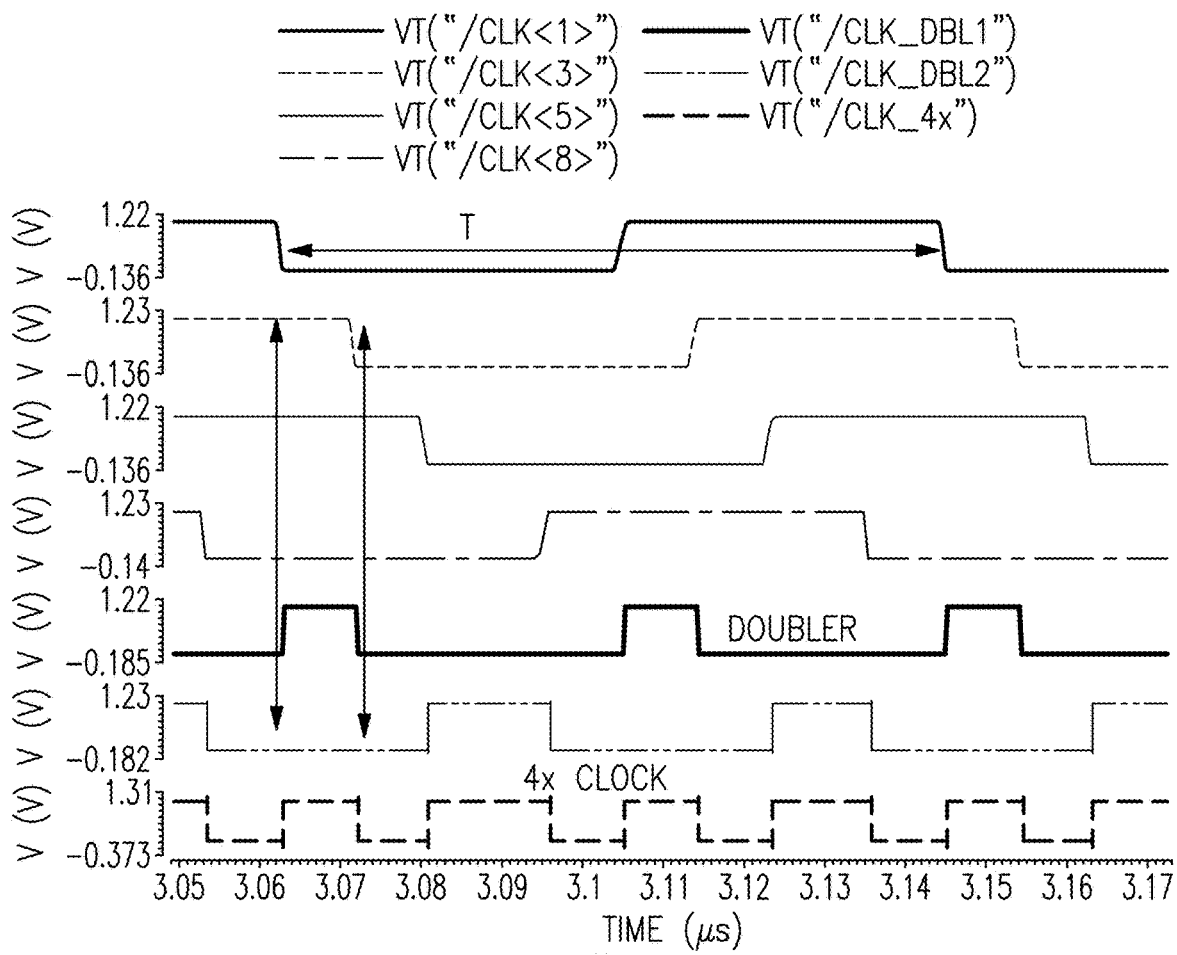
FIG. 8C is a graph of one example of waveforms for a charge pump clock generator.

FIG. 8C is a graph of one example of waveforms for a charge pump clock generator. The waveforms correspond to a charge pump clock generator that including the frequency multiplying logic 260 of FIG. 8B. As shown in FIG. 8C, frequency quadrupling is achieved.

Figure 9:
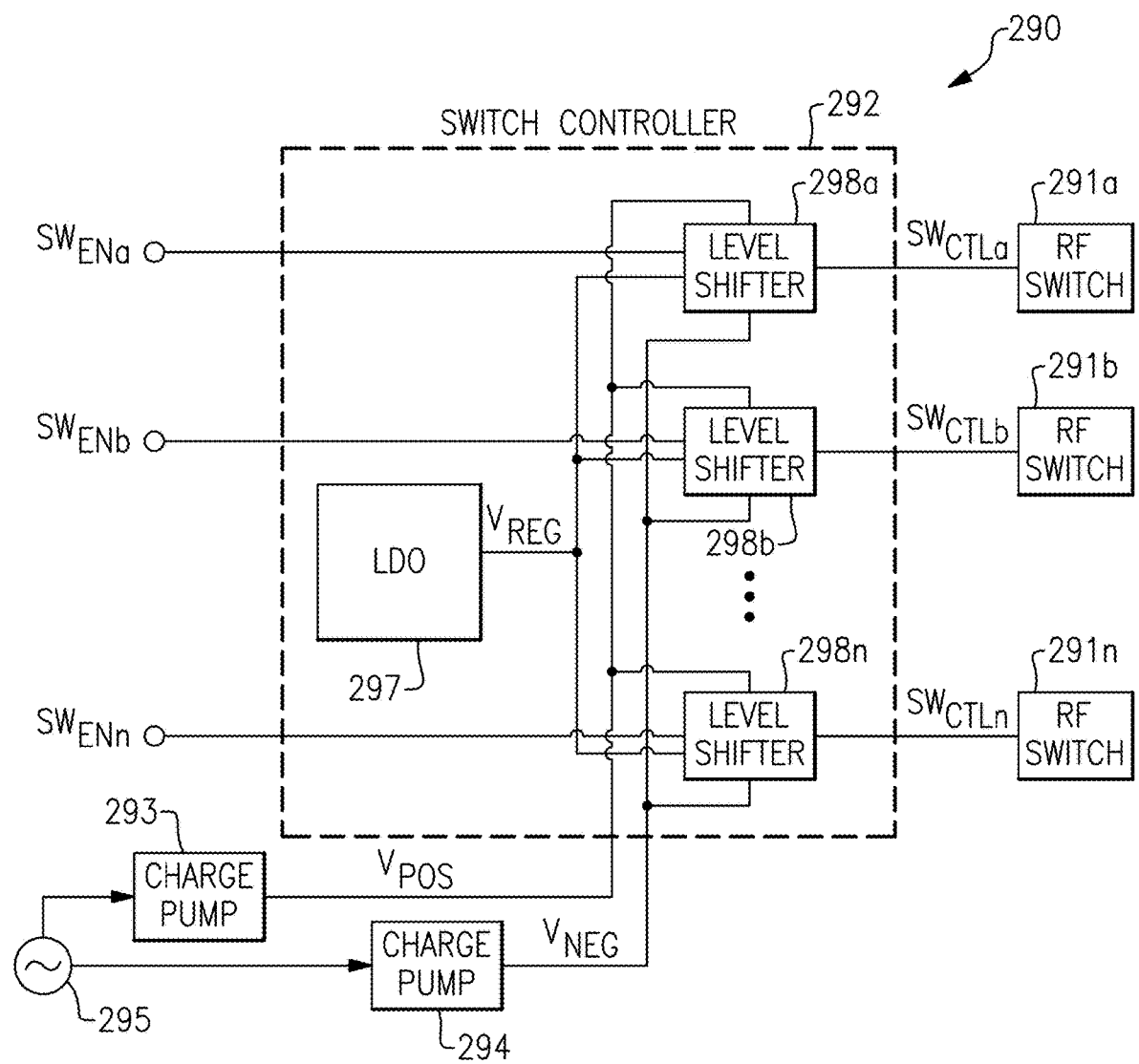
FIG. 9 is a schematic block diagram of a radio frequency (RF) switch system according to one embodiment.

FIG. 9 is a schematic block diagram of an RF switch system 290 according to one embodiment. The RF switch system 290 includes RF switches 291a, 291b, . . . 291n, a switch controller 292, a positive charge pump 293 that generates a positive charge pump voltage $V_{POS}$, a negative charge pump 294 that generates a negative charge pump voltage $V_{NEG}$, and a charge pump clock generator 295.

As shown in FIG. 9, the switch controller 292 includes a voltage regulator (corresponding to a low dropout regulator 297, in this example) that generates a regulated voltage $V_{REG}$, and level shifters 298a, 298b, . . . 298n.

The level shifters 298a, 298b, . . . 298n operate to level shift the switch enable signals $SW_{ENa}$, $SW_{ENb}$, . . . $SW_{ENn}$ to generate the switch control signals $SW_{CTLa}$, $SW_{CTLb}$, . . . $SW_{CTLn}$ for the RF switches 291a, 291b, . . . 291n, respectively. As shown in FIG. 9, the level shifters 298a, 298b, . . . 298n each receive the regulated voltage $V_{REG}$, the positive charge pump voltage $V_{POS}$, and the negative charge pump voltage $V_{NEG}$. Additionally, the charge pump clock generator 295 generates clock signals for the positive charge pump 293 and the negative charge pump 294.

The level shifters 298a, 298b, . . . 298n and/or the charge pump clock generator 295 can be implemented in accordance with any of the embodiments herein.

Although the illustrated RF switch system 290 includes three level shifters and three switches, any number of level shifters and switches can be included.

Figure 10A:
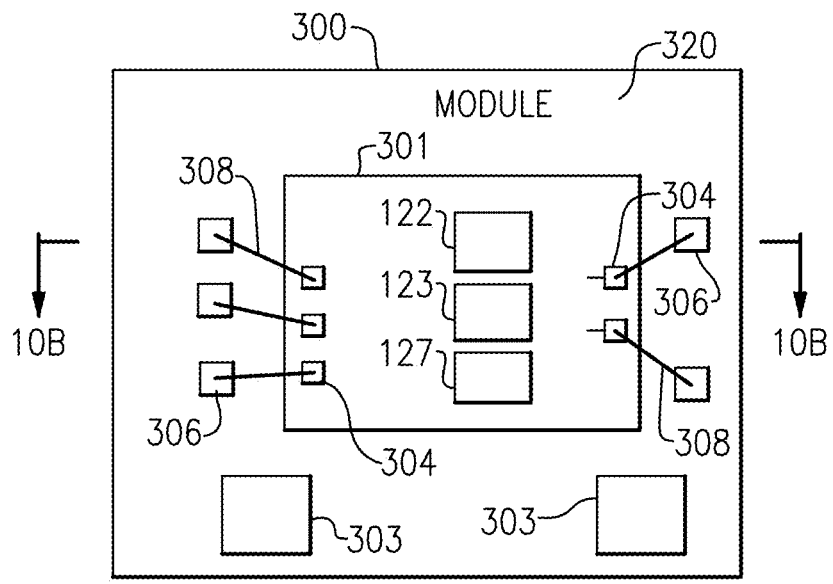
FIG. 10A is a schematic diagram of one embodiment of a packaged module.
Figure 10B:
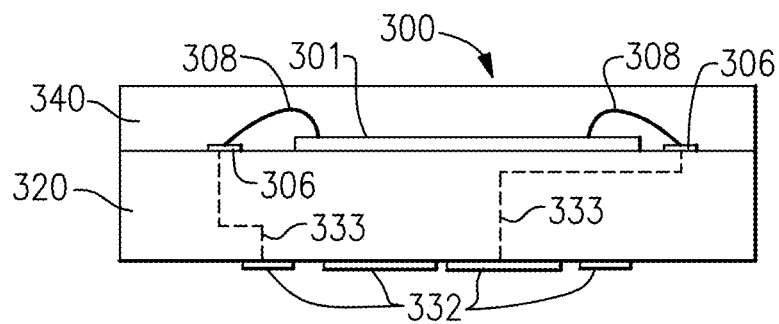
FIG. 10B is a schematic diagram of a cross-section of the packaged module of FIG. 10A taken along the lines 10B-10B.

FIG. 10A is a schematic diagram of one embodiment of a packaged module 300. FIG. 10B is a schematic diagram of a cross-section of the packaged module 300 of FIG. 10A taken along the lines 10B-10B.

The packaged module 300 includes an IC or die 301, surface mount components 303, wirebonds 308, a package substrate 320, and encapsulation structure 340. The package substrate 320 includes pads 306 formed from conductors disposed therein. Additionally, the die 301 includes pads 304, and the wirebonds 308 have been used to electrically connect the pads 304 of the die 301 to the pads 306 of the package substrate 301.

As illustrated in FIGS. 10A and 10B, the die 301 includes charge pumps 122, level shifter 123, and switches 127, which can be as described earlier.

The packaging substrate 320 can be configured to receive a plurality of components such as the die 301 and the surface mount components 303, which can include, for example, surface mount capacitors and/or inductors.

As shown in FIG. 10B, the packaged module 300 is shown to include a plurality of contact pads 332 disposed on the side of the packaged module 300 opposite the side used to mount the die 301. Configuring the packaged module 300 in this manner can aid in connecting the packaged module 300 to a circuit board such as a phone board of a wireless device. The example contact pads 332 can be configured to provide RF signals, bias signals, power low voltage(s) and/or power high voltage(s) to the die 301 and/or the surface mount components 303. As shown in FIG. 10B, the electrically connections between the contact pads 332 and the die 301 can be facilitated by connections 333 through the package substrate 320. The connections 333 can represent electrical paths formed through the package substrate 320, such as connections associated with vias and conductors of a multilayer laminated package substrate.

In some embodiments, the packaged module 300 can also include one or more packaging structures to, for example, provide protection and/or facilitate handling of the packaged module 300. Such a packaging structure can include overmold or encapsulation structure 340 formed over the packaging substrate 320 and the components and die(s) disposed thereon.

It will be understood that although the packaged module 300 is described in the context of electrical connections based on wirebonds, one or more features of the present disclosure can also be implemented in other packaging configurations, including, for example, flip-chip configurations.

Figure 11:
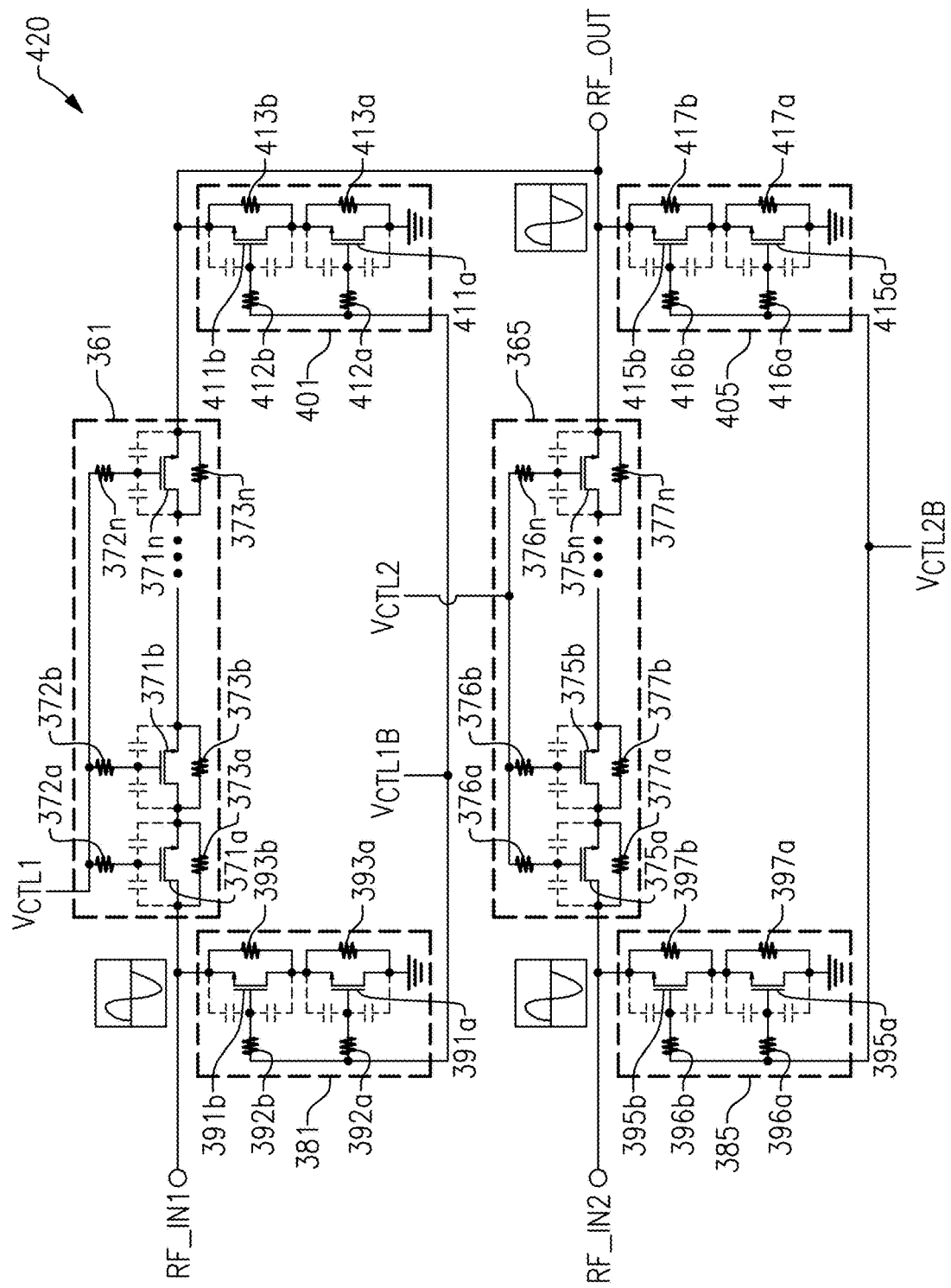
FIG. 11 is a schematic diagram of an RF switch network according to another embodiment.

FIG. 11 is a schematic diagram of an RF switch network 420 according to another embodiment. The RF switch network 420 includes a first series transistor switch 361, a second series transistor switch 365, a first input shunt transistor switch 381, a second input shunt transistor switch 385, a first output shunt transistor switch 401, and a second output shunt transistor switch 405.

The RF switch network 420 of FIG. 11 illustrates another embodiment of an RF switch network suitable for use in an RF switch system, such as the RF switch system 120 of FIG. 4. However other implementations are possible, including, but not limited, RF switch networks including more or fewer series transistor switches and/or more or fewer shunt transistor switches.

In the illustrated embodiment, the first series transistor switch 361 is electrically connected between a first RF input terminal RF_IN1 and an RF output terminal RF_OUT, and the second series transistor switch 365 is electrically connected between a second RF input terminal RF_IN2 and the RF output terminal RF_OUT. Additionally, the first input shunt transistor switch 381 is electrically connected between the first RF input terminal RF_IN1 and ground, and the second input shunt transistor 385 is electrically between the second RF input terminal RF_IN2 and ground. Furthermore, the first output shunt transistor switch 401 is electrically connected between the RF output terminal RF_OUT and ground, and the second output shunt transistor switch 405 is electrically connected between the RF output terminal RF_OUT and ground.

As shown in FIG. 11, a first switch control voltage $V_{CTL1}$ controls the first series transistor switch 361, and a first inverted switch control voltage $V_{CTL1B}$ controls the first input shunt transistor switch 381 and the first output shunt transistor switch 401. Furthermore, a second switch control voltage $V_{CTL2}$ controls the second series transistor switch 365, and a second inverted switch control voltage $V_{CTL2B}$ controls the second input shunt transistor switch 385 and the second output shunt transistor switch 405. In certain implementations, a first level shifter generates the first switch control voltage $V_{CTL1}$ and the first inverted switch control voltage $V_{CTL1B}$, while a second level shifter generates the second switch control voltage $V_{CTL2}$ and the second inverted switch control voltage $V_{CTL2B}$.

The depicted transistor switches each include a number of transistors in series to achieve a desired power handling capability, with the transistors biased used corresponding gate resistors and channel resistors.

For example, the first series transistor switch 361 includes NFETs 371a, 371b, . . . 371n, gate resistors 372a, 372b, . . . 372n, and channel resistors 373a, 373b, . . . 373n. Additionally, the second series transistor switch 365 includes NFETs 375a, 375b, . . . 375n, gate resistors 376a, 376b, . . . 376n, and channel resistors 377a, 377b, . . . 377n. Furthermore, the first input shunt transistor switch 381 includes NFETs 391a, 391b, gate resistors 392a, 392b, and channel resistors 393a, 393b. Additionally, the second input shunt transistor switch 385 includes NFETs 395a, 395b, gate resistors 396a, 396b, and channel resistors 397a, 397b. Furthermore, the first output shunt transistor switch 401 includes NFETs 411a, 411b, gate resistors 412a, 412b, and channel resistors 413a, 413b. Additionally, the second output shunt transistor switch 405 includes NFETs 415a, 415b, gate resistors 416a, 416b, and channel resistors 417a, 417b.

Figure 12:
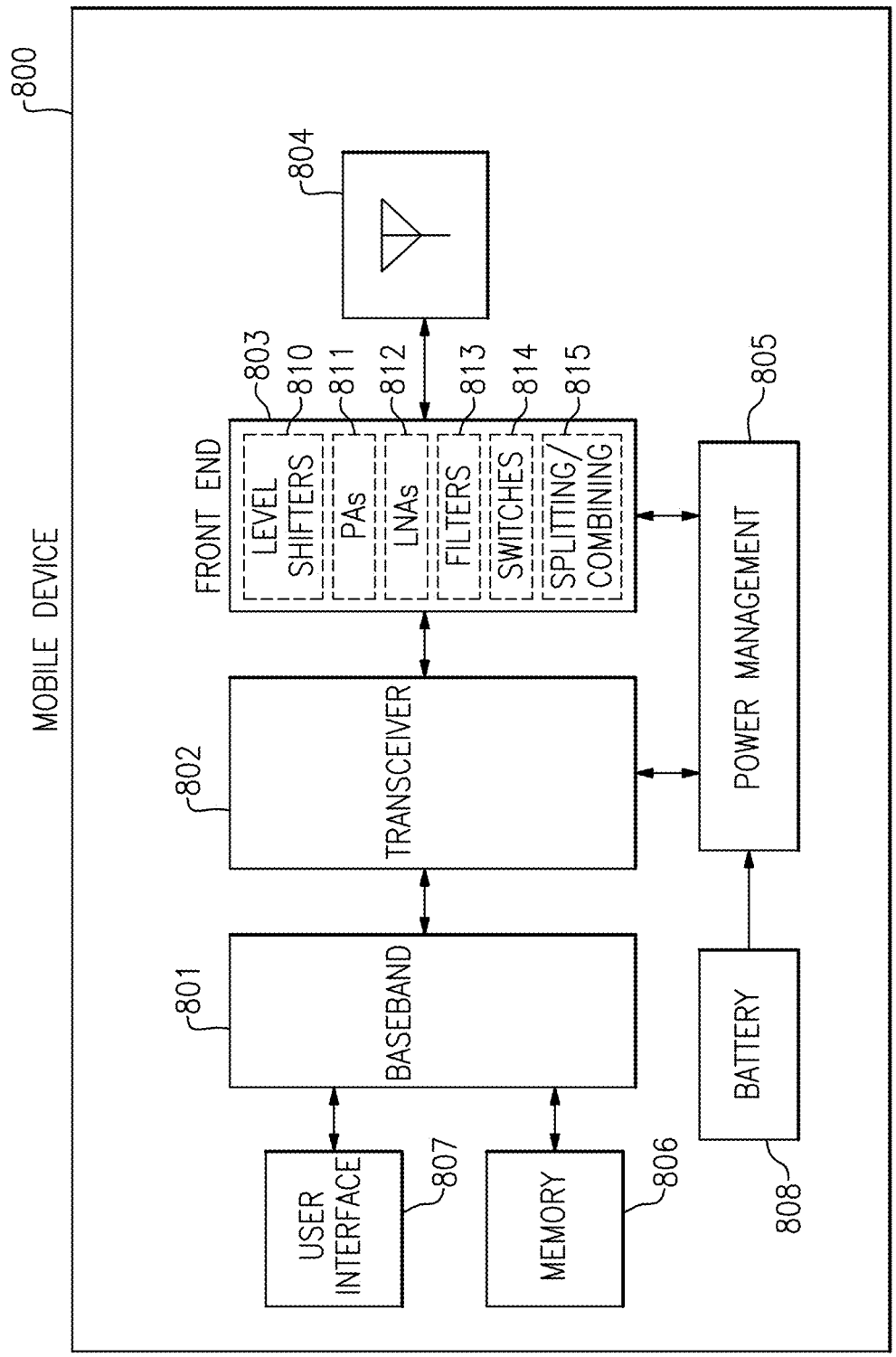
FIG. 12 is a schematic diagram of one embodiment of a mobile device.

FIG. 12 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 12 as the transceiver 802. In one example, separate components (for instance, separate circuits or dies) can be provided for handling certain types of RF signals.

The front end system 803 aids is conditioning signals transmitted to and/or received from the antennas 804. In the illustrated embodiment, the front end system 803 includes level shifters 810, power amplifiers (PAs) 811, low noise amplifiers (LNAs) 812, filters 813, switches 814, and signal splitting/combining circuitry 815. However, other implementations are possible.

For example, the front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include amplifiers having controllable gain and phase shifters having controllable phase to provide beam formation and directivity for transmission and/or reception of signals using the antennas 804. For example, in the context of signal transmission, the amplitude and phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 12, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 12, the power management system 805 receives a battery voltage from the battery 808. The battery 808 can be any suitable battery for use in the mobile device 800, including, for example, a lithium-ion battery.

The mobile device 800 can include any combination of features of the present disclosure. For example, in certain embodiments, the power management system 805 includes a positive charge pump that generates a positive charge pump voltage, a negative charge pump that generates a negative charge pump voltage, and a voltage regulator that generates a regulated voltage. Additionally, the front end system 803 includes an RF switch (of switches 814) controlled by a level shifter (of level shifters 810) with the level shifter receiving the positive charge pump voltage, the negative charge pump voltage, and the regulated voltage.

CONCLUSION

Some of the embodiments described above have provided examples in connection with mobile devices. However, the principles and advantages of the embodiments can be used for any other systems or apparatus that have needs for RF switching.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "may," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A mobile device comprising:
a power management system including a positive charge pump configured to generate a positive charge pump voltage, a negative charge pump configured to generate a negative charge pump voltage, and a voltage regulator configured to generate a regulated voltage; and
a front end system including a radio frequency switch controlled by a first switch control signal, and a level shifter operable to level shift a first switch enable signal to generate the first switch control signal at a first output, the level shifter including a first level-shifting n-type transistor and a first cascode n-type transistor in series between the negative charge pump voltage and the first output, a first level-shifting p-type transistor and a first cascode p-type transistor in series between the positive charge pump voltage and the first output, and a second cascode p-type transistor between the regulated voltage and a gate of the first level-shifting n-type transistor and controlled by the first switch enable signal.

2. The mobile device of claim 1 wherein the level shifter is further operable to level shift a second switch enable signal to generate a second switch control signal at a second output, the second switch enable signal of complementary polarity to the first switch enable signal.

3. The mobile device of claim 2 wherein the level shifter further includes a second level shifting n-type transistor in series with the second cascode p-type transistor between the regulated voltage and the negative charge pump voltage, a third cascode p-type transistor, and a third level shifting n-type transistor in series with the third cascode p-type transistor between the regulated voltage and the negative charge pump voltage.

4. The mobile device of claim 3 wherein the level shifter further includes a fourth level shifting n-type transistor and a second cascode n-type transistor in series between the second output and the negative charge pump voltage, and a second level shifting p-type transistor and a fourth cascode p-type transistor in series between the positive charge pump voltage and the second output.

5. The mobile device of claim 1 wherein the front end system further includes a power amplifier configured to provide a radio frequency signal to the radio frequency switch.

6. The mobile device of claim 1 wherein the power management system further includes a charge pump clock generator including a multi-phase oscillator configured to generate a plurality of oscillator clock signals, and a clock phase logic and combining circuit configured to process the plurality of oscillator clock signals to generate a first clock signal of higher frequency than an oscillation frequency of the multi-phase oscillator, the first clock signal operable to control at least one of the positive charge pump or the negative charge pump.

7. The mobile device of claim 6 wherein the clock phase logic and combining circuit is further configured to generate a second clock signal offset in phase from the first clock signal, the first clock signal operable to control the positive charge pump and the second clock signal operable to control the negative charge pump.

8. A radio frequency switch system comprising:
a radio frequency switch configured to receive a radio frequency signal and controlled by a first switch control signal;
a positive charge pump configured to generate a positive charge pump voltage;
a negative charge pump configured to generate a negative charge pump voltage;
a voltage regulator configured to generate a regulated voltage; and
a level shifter operable to level shift a first switch enable signal to generate the first switch control signal at a first output, the level shifter including a first level-shifting n-type transistor and a first cascode n-type transistor in series between the negative charge pump voltage and the first output, a first level-shifting p-type transistor and a first cascode p-type transistor in series between the positive charge pump voltage and the first output, and a second cascode p-type transistor between the regulated voltage and a gate of the first level-shifting n-type transistor and controlled by the first switch enable signal.

9. The radio frequency switch system of claim 8 wherein the level shifter is further operable to level shift a second switch enable signal to generate a second switch control signal at a second output, the second switch enable signal of complementary polarity to the first switch enable signal.

10. The radio frequency switch system of claim 9 wherein the level shifter further includes a second level shifting n-type transistor in series with the second cascode p-type transistor between the regulated voltage and the negative charge pump voltage, a third cascode p-type transistor, and a third level shifting n-type transistor in series with the third cascode p-type transistor between the regulated voltage and the negative charge pump voltage.

11. The radio frequency switch system of claim 10 wherein the level shifter further includes a fourth level shifting n-type transistor and a second cascode n-type transistor in series between the negative charge pump voltage and the second output, and a second level shifting p-type transistor and a fourth cascode p-type transistor in series between the positive charge pump voltage and the second output.

12. The radio frequency switch system of claim 11 further comprising a first enable level shifting circuit configured to level shift the first switch enable signal to generate a first level shifted switch enable signal that controls a gate of the second level shifting p-type transistor, and a second enable level shifting circuit configured to level shift the second switch enable signal to generate a second level shifted switch enable signal that controls a gate of the first level shifting p-type transistor.

13. The radio frequency switch system of claim 11 wherein a gate of the first cascode p-type transistor and a gate of the fourth cascode p-type transistor are connected to a ground voltage.

14. The radio frequency switch system of claim 11 wherein a gate of the second level shifting n-type transistor and a gate of the fourth level shifting n-type transistor are connected to a drain of the third level shifting n-type transistor, and the gate of the first level shifting n-type transistor and a gate of the third level shifting n-type transistor are connected to a drain of the second level shifting n-type transistor.

15. The radio frequency switch system of claim 9 wherein the radio frequency switch includes a series transistor switch electrically connected between an input terminal and an output terminal and controlled by the first switch control signal, and a shunt transistor switch electrically connected between the input terminal and a ground voltage and controlled by the second switch control signal.

16. The radio frequency switch system of claim 8 further comprising a charge pump clock generator including a multi-phase oscillator configured to generate a plurality of oscillator clock signals, and a clock phase logic and combining circuit configured to process the plurality of oscillator clock signals to generate a first clock signal of higher frequency than an oscillation frequency of the multi-phase oscillator, the first clock signal operable to control at least one of the positive charge pump or the negative charge pump.

17. The radio frequency switch system of claim 16 wherein the clock phase logic and combining circuit is further configured to generate a second clock signal offset in phase from the first clock signal, the first clock signal operable to control the positive charge pump and the second clock signal operable to control the negative charge pump.

18. The radio frequency switch system of claim 8 wherein the voltage regulator is a low dropout regulator.

19. A level shifter for a radio frequency switch, the level shifter comprising:
a first level-shifting n-type transistor;
a first cascode n-type transistor in series with the first level-shifting n-type transistor between a negative charge pump voltage and a first output that provides a first switch control signal;
a first level-shifting p-type transistor;
a first cascode p-type transistor in series with the first level-shifting p-type transistor between a positive charge pump voltage and the first output; and
a second cascode p-type transistor between a regulated voltage and a gate of the first level-shifting n-type transistor and controlled by a first switch enable signal.

20. The level shifter of claim 19 further comprising a second level shifting n-type transistor in series with the second cascode p-type transistor between the regulated voltage and the negative charge pump voltage, a third cascode p-type transistor, and a third level shifting n-type transistor in series with the third cascode p-type transistor between the regulated voltage and the negative charge pump voltage.

\* \* \* \* \*